(12) United States Patent
Peng et al.

(10) Patent No.: US 10,216,094 B2
(45) Date of Patent: Feb. 26, 2019

(54) SUPPORT DEVICE AND METHOD FOR SUPPORTING LENS AND SUPPORT COMPONENT FOR SUPPORTING FUNCTIONAL ELEMENT

(71) Applicant: NATIONAL APPLIED RESEARCH LABORATORIES, Taipei (TW)

(72) Inventors: Wei-Jei Peng, Taipei (TW); Wei-Yao Hsu, Taipei (TW); Wen-Lung Lin, Taipei (TW); Cheng-Fang Ho, Taipei (TW); Chien-Yao Huang, Taipei (TW); Ching-Hsiang Kuo, Taipei (TW)

(73) Assignee: NATIONAL APPLIED RESEARCH LABORATORIES, Taipei (TW)

( * ) Notice: Subject to any disclaimer, the term of this patent is extended or adjusted under 35 U.S.C. 154(b) by 0 days.

(21) Appl. No.: 15/603,557

(22) Filed: May 24, 2017

(65) Prior Publication Data

US 2018/0120712 A1 May 3, 2018

(30) Foreign Application Priority Data

Oct. 27, 2016 (TW) .............................. 105134864 A

(51) Int. Cl.
*G02B 7/02* (2006.01)
*G03F 7/20* (2006.01)
*F16M 13/02* (2006.01)

(52) U.S. Cl.
CPC .......... *G03F 7/70316* (2013.01); *F16M 13/02* (2013.01); *G02B 7/02* (2013.01); *G03F 7/70825* (2013.01)

(58) Field of Classification Search
CPC .. G03F 7/70316; G03F 7/0825; G03F 7/0241; F16M 13/02; G02B 7/022; G02B 7/026; G02B 7/028
(Continued)

(56) References Cited

U.S. PATENT DOCUMENTS 4,600,272 A * 7/1986 Dost ...................... G02B 7/182
359/831
4,733,945 A * 3/1988 Bacich ................ G03F 7/70825
359/820

(Continued)

FOREIGN PATENT DOCUMENTS

CN 102279454 B 12/2011
EP 0230277 B1 7/1987

*Primary Examiner* — Anita M King
(74) *Attorney, Agent, or Firm* — Haynes and Boone, LLP

(57) ABSTRACT

A support device for supporting a lens includes a support component. The support component includes a main body, a plurality of first support portions and a plurality of second support portions. Each of the plurality of first support portions is disposed on the main body, has a first support position thereon having a first height, and is configured to rigidly support the lens. Each of the plurality of second support portions is disposed on the main body, has a second support position thereon having a second height, and is configured to flexibly support the lens. When a configuration relationship between the support component and the lens becomes a decoupling relationship, the second height is larger than the first height. When the configuration relationship is changed to a coupling relationship, an absolute difference value between the first and the second heights is less than a threshold.

20 Claims, 11 Drawing Sheets

(58) Field of Classification Search
USPC .......................................... 359/819, 811, 818
See application file for complete search history.

(56) References Cited

U.S. PATENT DOCUMENTS

| | | |
|---|---|---|
| 6,239,924 B1 | 5/2001 | Watson et al. |
| 6,400,516 B1 | 6/2002 | Spinali |
| 6,594,093 B2 | 7/2003 | Moeller et al. |
| 6,930,842 B2 * | 8/2005 | Shibazaki .............. G02B 7/005 355/77 |
| 7,085,080 B2 | 8/2006 | Schaffer et al. |
| 7,903,353 B2 | 3/2011 | Reichmann et al. |
| 8,654,461 B2 | 2/2014 | Park et al. |
| 8,919,724 B2 * | 12/2014 | Rangaswamy ........ G02B 7/028 248/603 |
| 9,918,005 B2 * | 3/2018 | Nakamaru ......... H04N 5/23212 |

* cited by examiner

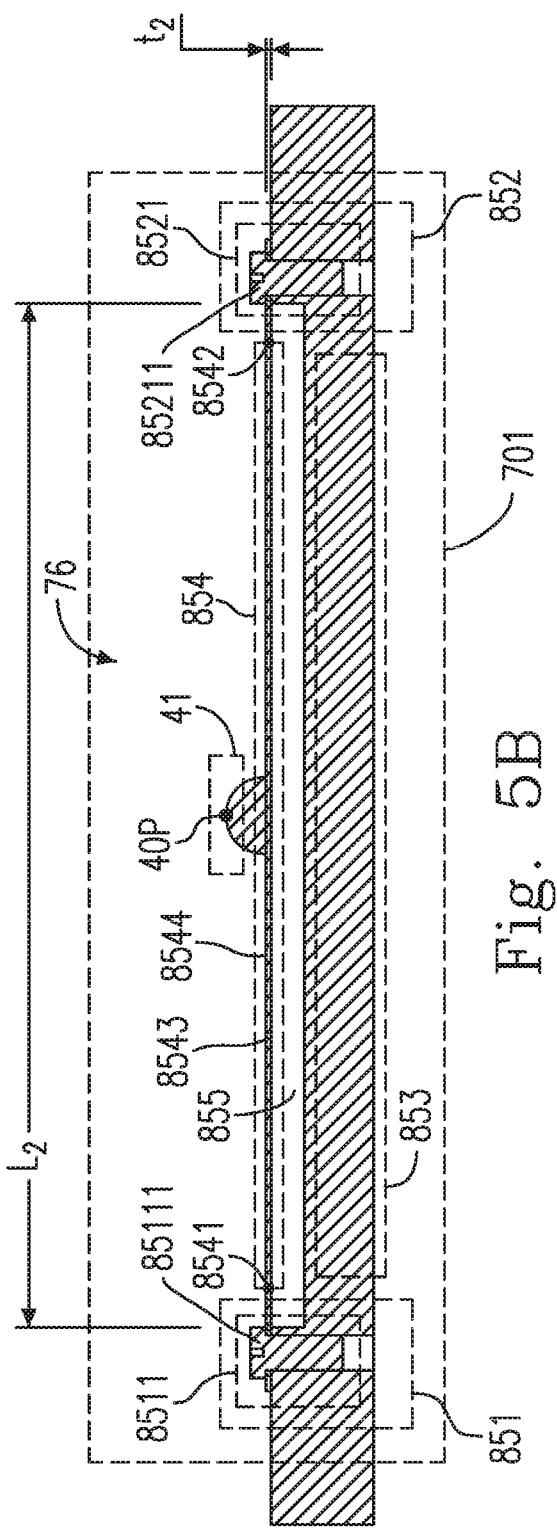
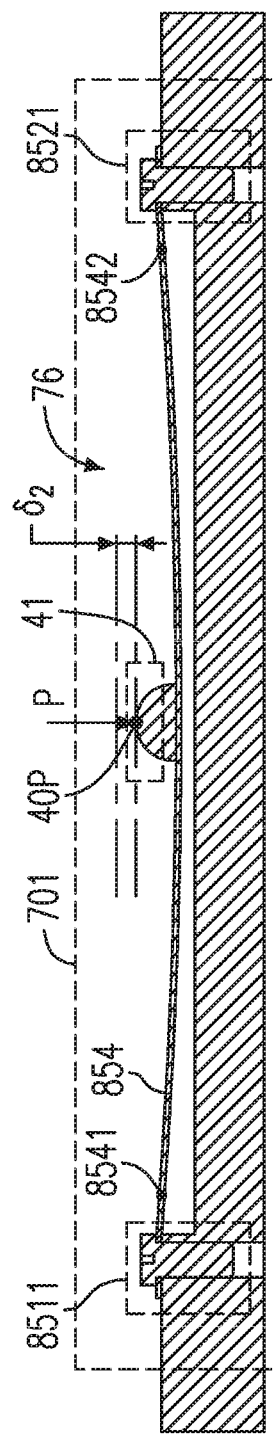
Fig. 5B
Fig. 5C

SUPPORT DEVICE AND METHOD FOR SUPPORTING LENS AND SUPPORT COMPONENT FOR SUPPORTING FUNCTIONAL ELEMENT

CROSS-REFERENCE TO RELATED APPLICATION AND CLAIM OF PRIORITY

The application claims the benefit of Taiwan Patent Application No. 105134864, filed on Oct. 27, 2016, at the Taiwan Intellectual Property Office, the disclosures of which are incorporated herein in their entirety by reference.

TECHNICAL FIELD

The present disclosure is related to a support device and, more particularly, is related to a support device and a method for supporting a lens.

BACKGROUND

In the semiconductor industry, the lens of an exposure apparatus is used to perform a magnification conversion to a pattern of a mask, thereby transferring the pattern onto a wafer. The resolution dimensions on the wafer are at least a micrometer or smaller; because the resolution dimension approaches the dimension of the diffraction limit, the optical quality is estimated by considering the wavefront error. In view of the wavefront, any deformation occurring on a lens surface can change the phase of a light wave, so that through the wavefront distortion of each lens, the light wave on the imaging surface can create a superposed final wavefront error. Therefore, a lens assembly including a large-diameter lens (having an outer diameter ($\varphi$>150 mm) can suffer the following situation: even if the lens is perfect and is located in a correct position, a good image-forming quality cannot be guaranteed. The reason for this situation is that the lens surface deformation and the stress, generated from the lens own-gravity and the lens clamping, cause the optical quality to decrease. When a firmly fixed mechanism of an annular support used for a common miniature lens is applied to the large-diameter lens, the deformation generated by the firmly fixed mechanism is too large; therefore, it is unsuitable to apply the firmly fixed mechanism to the large-diameter lens, and it is necessary to use an additional specific design.

A firmly fixed mechanism applied to the large-diameter lens basically follows the kinematic principle of the design concept: the freedoms of a rigid body include three translation freedoms and three rotation freedoms; in order to firmly fix an element, it is necessary to apply six linearly independent constraint forces; when an element is clamped in a situation of over constraint, the clamped element can still have inner stress and deformation; when the clamping condition meets a kinematic constraint condition, the deformation of the element can be minimized. However, the rigid contact of the kinematic principle is assumed to be a point contact. The point contact applied to the lens can result in a problem that the contact stress is too large, so that the contact point is enlarged to form a small-area contact; such a design is called a semi-kinematic design. In the prior art, many firmly fixed mechanisms applied to large-diameter lenses are designed according to this semi-kinematic principle.

U.S. Pat. No. 7,085,080 B2 discloses a low-deformation support device of an optical element. U.S. Pat. No. 6,594,093 B2 discloses an adjusting apparatus for an optical element in a lens system. U.S. Pat. No. 6,239,924 B1 discloses a kinematic lens mounting with distributed support and radial flexure. U.S. Pat. No. 6,400,516 B1 discloses a kinematic optical mounting. European Patent No. 0230277 B1 discloses a precision lens mounting. U.S. Pat. No. 8,654,461 B2 discloses a lens positioning unit of an optical system. U.S. Pat. No. 7,903,353 B2 discloses a laterally adjustable optical mount with bent lever manipulator units. China Patent No. 102279454 B discloses a support device of a lens in a photoetching projection objective.

SUMMARY OF EXEMPLARY EMBODIMENTS

It is one aspect of the present disclosure to provide a support device for supporting a lens to reduce the own-gravity deformation of the lens, and thereby accomplish the technical effect of extremely low lens surface deformation.

It is therefore one embodiment of the present disclosure to provide a support device for supporting a lens. The support device includes a support component. The support component includes a main body, a plurality of first support portions and a plurality of second support portions. The plurality of first support portions are disposed on the main body, wherein each of the plurality of first support portions has a first support position thereon having a first height, and is configured to rigidly support the lens. The plurality of second support portions are disposed on the main body, wherein each of the plurality of second support portions is disposed between respective adjacent two of the plurality of first support portions, has a second support position thereon having a second height, and is configured to flexibly support the lens. When a configuration relationship between the support component and the lens becomes a decoupling relationship, the second height is larger than the first height. When the configuration relationship is changed to a coupling relationship, an absolute difference value between the first and the second heights is less than a threshold.

It is therefore another embodiment of the present disclosure to provide a support method for supporting a lens. The support method includes the following steps. A support component is provided, wherein the support component includes a main body, a plurality of first support portions disposed on the main body, and a plurality of second support portions disposed on the main body; each of the plurality of first support portions has a first support position thereon having a first height, and is configured to rigidly support the lens; and each of the plurality of second support portions is disposed between respective adjacent two of the plurality of first support portions, has a second support position thereon having a second height, and is configured to flexibly support the lens. When a configuration relationship between the support component and the lens forms a decoupling relationship, the second height is caused to be larger than the first height. When the configuration relationship is changed to a coupling relationship, an absolute difference value between the first and the second heights is caused to be less than a threshold.

It is therefore still another embodiment of the present disclosure to provide a support component for supporting a functional element. The support component includes a main body, a plurality of first support portions and a plurality of second support portions. The plurality of first support portions are disposed on the main body, wherein each of the plurality of first support portions has a first support position thereon having a first height, and is configured to rigidly support the functional element. The plurality of second support portions are disposed on the main body, wherein each of the plurality of second support portions is disposed between respective adjacent two of the plurality of first support portions, has a second support position thereon having a second height, and is configured to flexibly support the functional element. When a configuration relationship between the support component and the functional element is a decoupling relationship, the second height is larger than the first height. When the configuration relationship is a coupling relationship, an absolute difference value between the first and the second heights is less than a threshold.

BRIEF DESCRIPTION OF THE DRAWINGS

The foregoing and other features and advantages of the present disclosure will be more clearly understood through the following descriptions with reference to the drawings, wherein:

FIGS. 5B and 5C are schematic diagrams respectively showing cross-sectional views of an implementation structure of a central portion of the support component according to various embodiments of the present disclosure;

DETAILED DESCRIPTION OF THE PREFERRED EMBODIMENTS

The present disclosure will now be described more specifically with reference to the following embodiments. It is to be noted that the following descriptions of preferred embodiments of this disclosure are presented herein for the purposes of illustration and description only; they are not intended to be exhaustive or to be limited to the precise form disclosed.

Figure 1A:
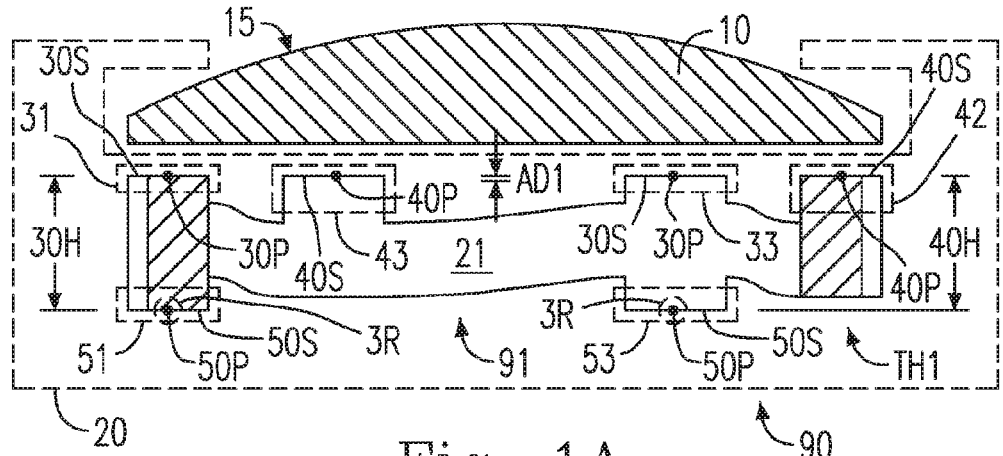
FIG. 1A is a schematic diagram showing a side cross-sectional view of a configuration relationship between a lens and a support component included in a support device when the configuration relationship forms a coupling relationship.
Figure 1B:
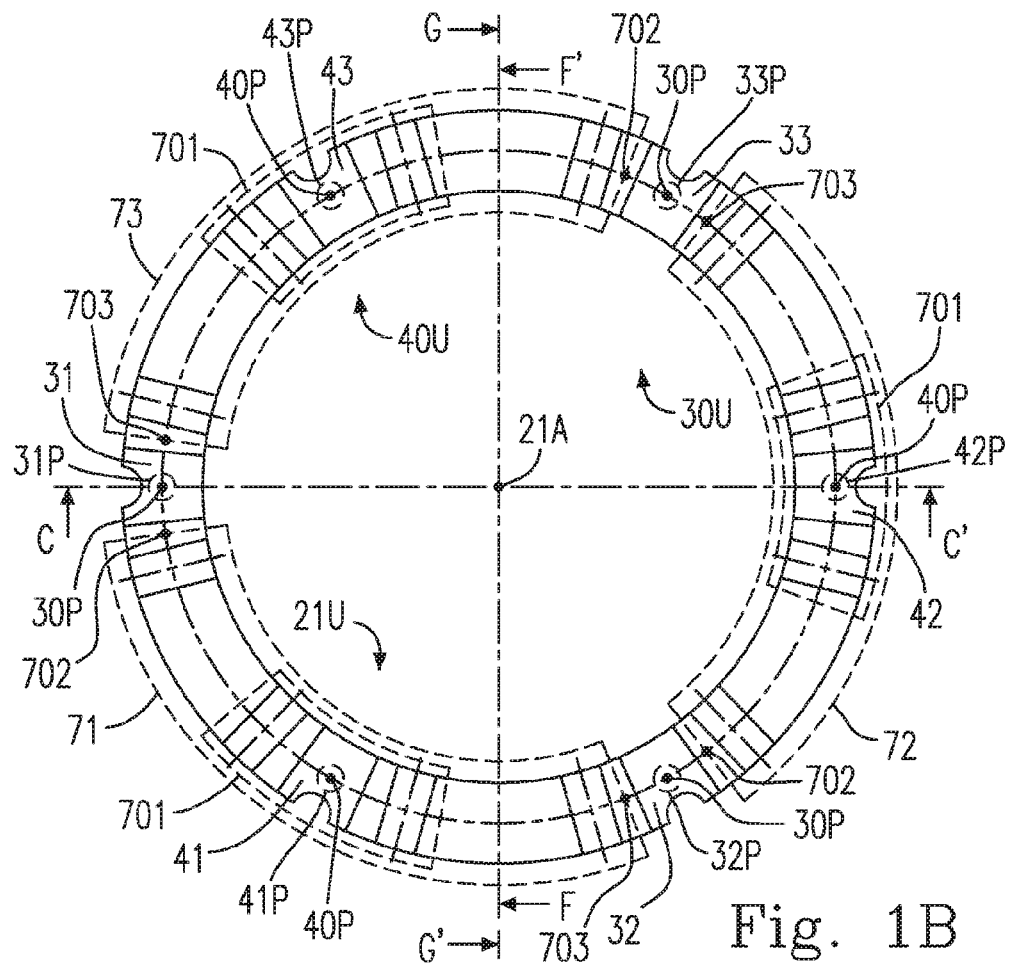
FIG. 1B is a schematic diagram showing a top view of the support component when the configuration relationship forms a decoupling relationship.
Figure 1C:
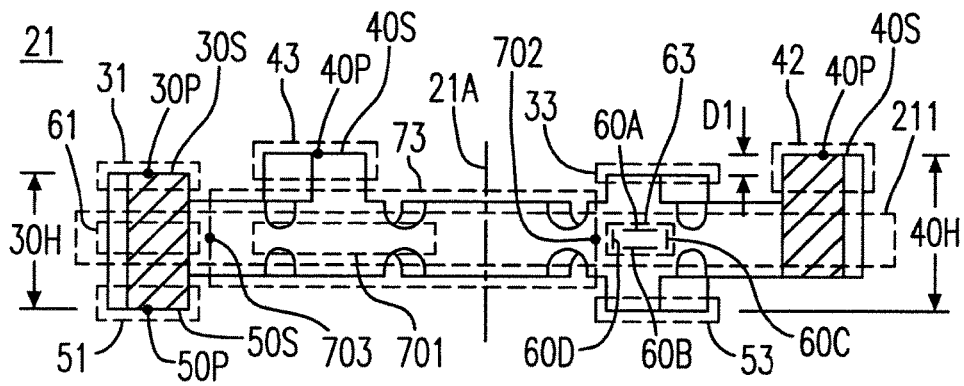
FIG. 1C is a schematic diagram showing a front cross-sectional view of the support component at a reference line CC' marked in FIG. 1B when the configuration relationship forms the decoupling relationship.
Figure 1D:
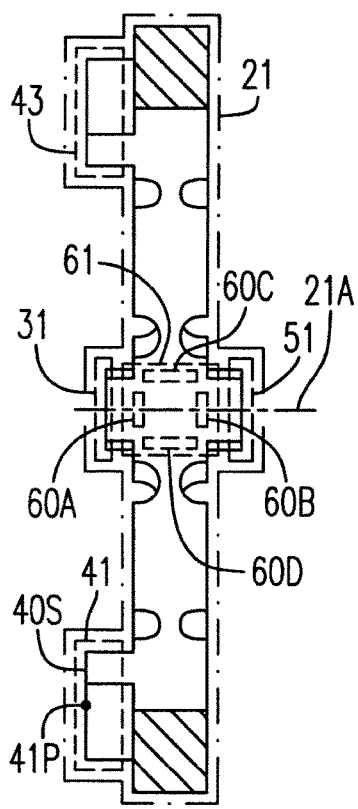
FIG. 1D is a schematic diagram showing a right side cross-sectional view of the support component at a reference line FF' marked in FIG. 1B when the configuration relationship forms the decoupling relationship.
Figure 1E:
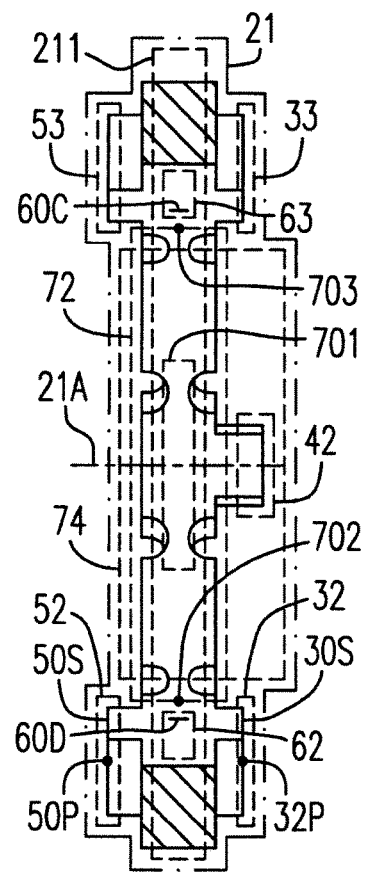
FIG. 1E is a schematic diagram showing a left side cross-sectional view of the support component at the reference line GG' marked in FIG. 1B when the configuration relationship forms the decoupling relationship.
Figure 1F:
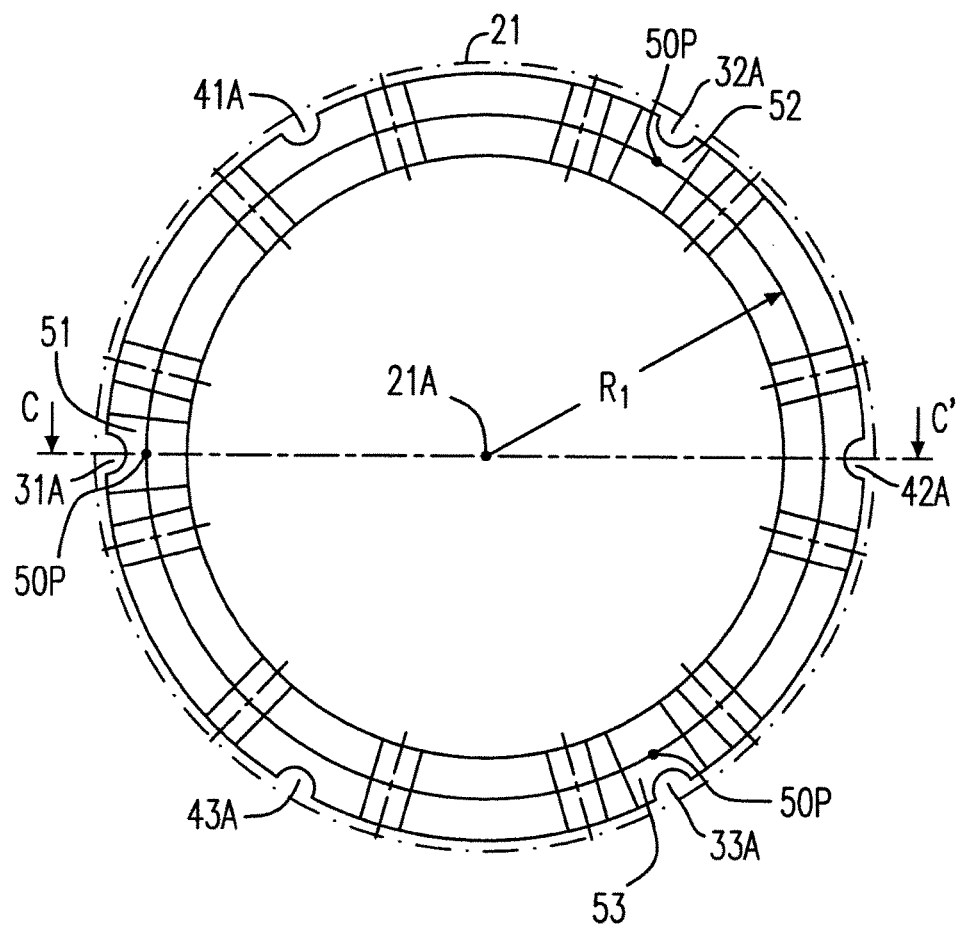
FIG. 1F is a schematic diagram showing a bottom view of the support component when the configuration relationship forms the decoupling relationship.

Please refer to FIG. 1A, FIG. 1B, FIG. 1C, FIG. 1D, FIG. 1E and FIG. 1F. FIG. 1A is a schematic diagram showing a side cross-sectional view of a configuration relationship between a lens 10 and a support component 21 included in a support device 20 when the configuration relationship forms a coupling relationship. FIG. 1B is a schematic diagram showing a top view of the support component 21 when the configuration relationship forms a decoupling relationship. FIG. 1C is a schematic diagram showing a front cross-sectional view of the support component 21 at the reference line CC' marked in FIG. 1B when the configuration relationship forms the decoupling relationship. FIG. 1D is a schematic diagram showing a right side cross-sectional view of the support component 21 at the reference line FF' marked in FIG. 1B when the configuration relationship forms the decoupling relationship. FIG. 1E is a schematic diagram showing a left side cross-sectional view of the support component 21 at the reference line GG' marked in FIG. 1B when the configuration relationship forms the decoupling relationship. FIG. 1F is a schematic diagram showing a bottom view of the support component 21 when the configuration relationship forms the decoupling relationship.

As shown in FIGS. 1A, 1B, 1C, 1D, 1E and 1F, a support device 20 for supporting a lens 10 includes a support component 21. The support component 21 includes a main body 211, a plurality of first support portions 31, 32 and 33, and a plurality of second support portions 41, 42 and 43. The plurality of first support portions 31, 32 and 33 are disposed on the main body 211, wherein each of the plurality of first support portions 31, 32 and 33 has a first support position 30P thereon having a first height 30H, and is configured to rigidly support the lens 10. The plurality of second support portions 41, 42 and 43 are disposed on the main body 211, wherein each (such as 42) of the plurality of second support portions 41, 42 and 43 is disposed between respective adjacent two (such as 32 and 33) of the plurality of first support portions 31, 32 and 33, has a second support position 40P thereon having a second height 40H, and is configured to flexibly support the lens 10. When a configuration relationship between the support component 21 and the lens 10 becomes a decoupling relationship, the second height 40H is larger than the first height 30H. When the configuration relationship is changed to a coupling relationship, an absolute difference value AD1 between the first and the second heights 30H and 40H is less than a threshold TH1.

For instance, each of the plurality of first support portions 31, 32 and 33 has a support reference position 3R, and each of the first and the second heights 30H and 40H refers to the support reference position 3R. When the configuration relationship forms the decoupling relationship, the second height 40H of the second support position 40P is larger than the first height 30H of the first support position 30P by a height difference D1. For instance, the support component 21 is formed in one piece. For instance, each of the plurality of second support portions 41, 42 and 43 is mounted on the main body 211 through at least a fastening component (not shown). For instance, a ratio of the threshold TH1 to the height difference D1 is equal to a specific ratio between 0 and 1 to cause the threshold TH1 to be less than the height difference D1.

In some embodiments, each of the plurality of first support portions 31, 32 and 33 protrudes from the main body 211, and includes a first support surface 30S having the first support position 30P. Each of the plurality of second support portions 41, 42 and 43 protrudes from the main body 211, and includes a second support surface 40S having the second support position 40P. The plurality of first support positions 31P, 32P and 33P (30P) are evenly spaced to form a first polar support position array 30U. The plurality of second support positions 41P, 42P and 43P (40P) are evenly spaced to form a second polar support position array 40U. The plurality of first support positions 31P, 32P and 33P (30P) and the plurality of second support positions 41P, 42P and 43P (40P) are evenly spaced to form a third polar support position array 21U.

The support component 21 further includes a plurality of third support portions 51, 52 and 53 respectively opposite to the plurality of first support portions 31, 32 and 33 in relation to the main body 211. Each of the plurality of third support portions 51, 52 and 53 protrudes from the main body 211, and includes a third support surface 50S having a third support position 50P; and the first support surface 30S is opposite to the third support surface 50S in relation to the main body 211. When the configuration relationship forms the coupling relationship, each of third support portions 51, 52 and 53 rigidly supports the main body 211, so that the support component 21 supports the lens 10 to form the coupling relationship. For instance, the respective third support position 50P serves as the respective support reference position 3R.

In some embodiments, the main body 211 forms a ring, and includes a plurality of rigid body portions 61, 62 and 63, and a plurality of flexible body portions 71, 72 and 73, wherein each (such as 72) of the plurality of flexible body portions 71, 72 and 73 and a corresponding one (such as 42) of the plurality of second support portions 41, 42 and 43 constitute a support beam 74. The plurality of first support portions 31, 32 and 33 are respectively disposed on the plurality of rigid body portions 61, 62 and 63, and the plurality of rigid body portions 61, 62 and 63 are respectively disposed on the plurality of third support portions 51, 52 and 53. Each of the plurality of rigid body portions 61, 62 and 63 includes a first side 60A, a second side 60B opposite to the first side 60A, a third side 60C adjacent to the first and the second sides 60A and 60B, and a fourth side 60D opposite to the third side 60C. The respective first support portion (such as 31) is disposed on the respective first side 60A, and the respective third support portion (such as 51) is coupled to the respective second side 60B. The plurality of second support portions 41, 42 and 43 are respectively disposed on the plurality of flexible body portions 71, 72 and 73.

In some embodiments, each of the plurality of flexible body portions 71, 72 and 73 includes a central portion 701, a first terminal 702 in relation to the central portion 701, and a second terminal 703 opposite to the first terminal 702. The respective second support portion (such as 42) is disposed on the respective central portion 701. Each (such as 72) of the plurality of flexible body portions 71, 72 and 73 is disposed between respective adjacent two (such as 62 and 63) of the plurality of rigid body portions 61, 62 and 63. The respective first terminal 702 is coupled to the respective fourth side 60D of one (such as 62) of respective adjacent two (such as 62 and 63) of the plurality of rigid body portions 61, 62 and 63, and the respective second terminal 703 is coupled to the respective third side 60C of the other (such as 63) of the respective adjacent two (such as 62 and 63) of the plurality of rigid body portions 61, 62 and 63.

In some embodiments, the support component 21 further includes a central axis 21A, a plurality of first outer locating notches 31A, 32A and 33A respectively corresponding to the plurality of first support portions 31, 32 and 33, and a plurality of second outer locating notches 41A, 42A and 43A respectively corresponding to the plurality of second support portions 41, 42 and 43. Each of the plurality of first outer locating notches 31A, 32A and 33A has a portion formed on a respective one of the plurality of first support portions 31, 32 and 33. Each of the plurality of second outer locating notches 41A, 42A and 43A has a portion formed on a respective one of the plurality of second support portions 41, 42 and 43.

Figure 2A:
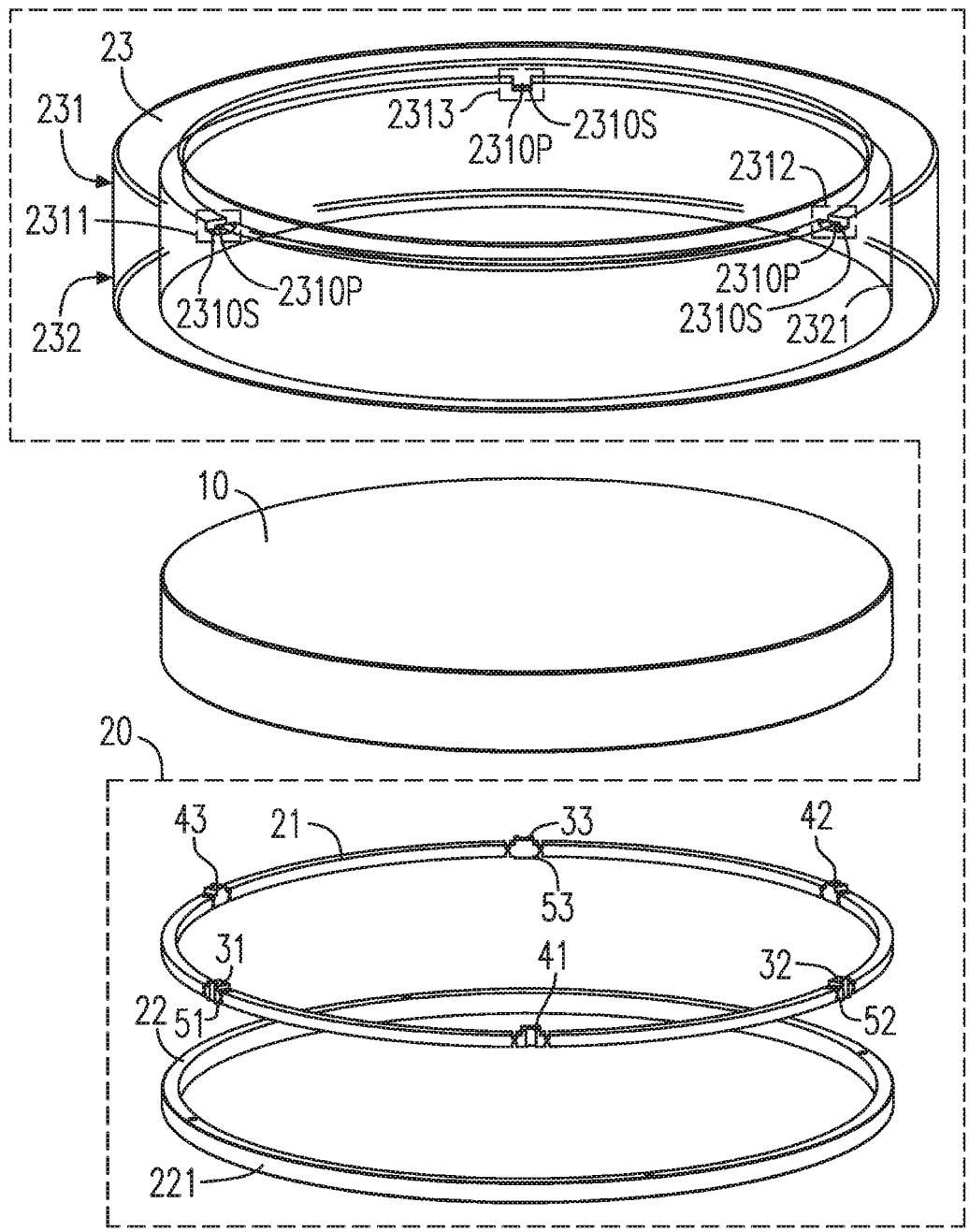
FIG. 2A and FIG. 2B are schematic diagrams respectively showing a disassembled state and an assembled state of the support component and the lens according to various embodiments of the present disclosure.
Figure 2B:
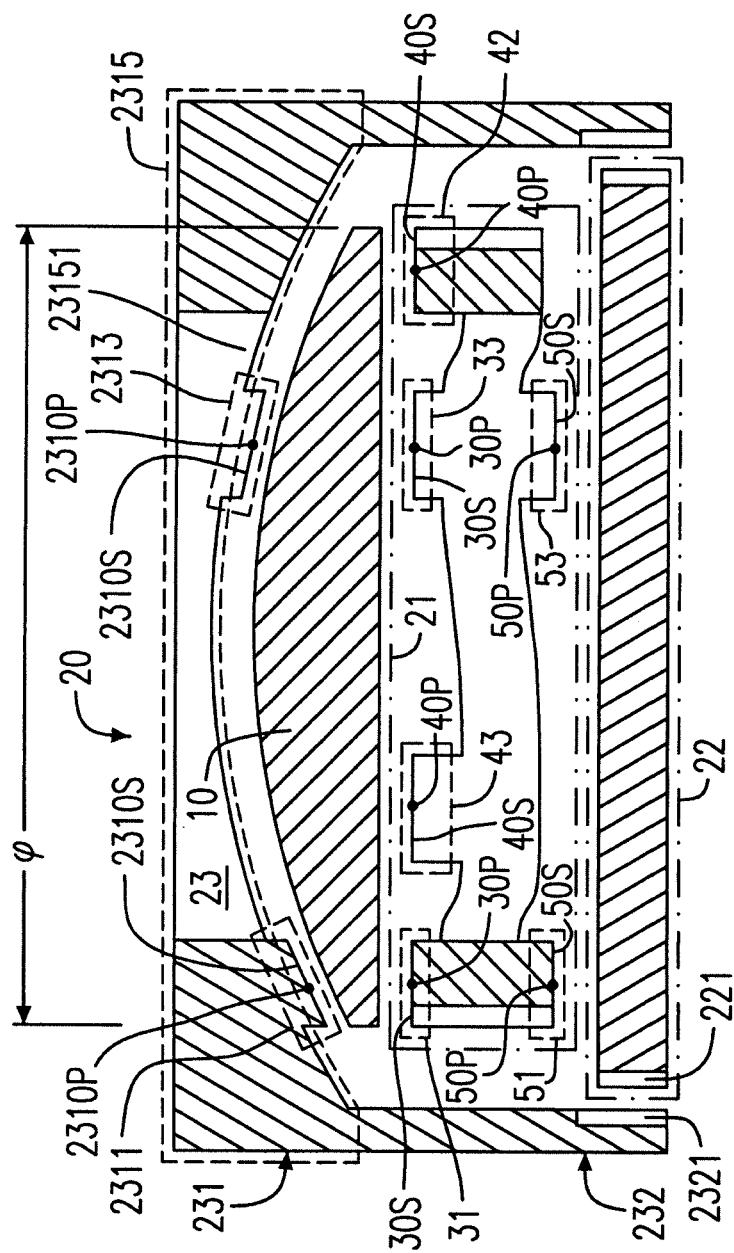

Please refer to FIG. 2A and FIG. 2B, which are schematic diagrams respectively showing a disassembled state and an assembled state of the support component 21 and the lens 10 according to various embodiments of the present disclosure. As shown in FIGS. 2A and 2B, the support device 20 further includes a retainer 22 and a sleeve 23. The retainer 22 includes a peripheral thread structure 221, wherein when the configuration relationship is the coupling relationship, the support component is disposed on the retainer 22 by using the plurality of third support portions 51, 52 and 53.

The sleeve 23 includes a fifth side 231 and a sixth side 232 opposite to the fifth side 231. The fifth side 231 includes a first body 2315, and a plurality of fourth support portions 2311, 2312 and 2313. The first body 2315 has an inner portion 23151. The plurality of fourth support portions 2311, 2312 and 2313 are configured to be coupled to the lens 10, and respectively correspond to the plurality of first support portions 31, 32 and 33. Each of the plurality of fourth support portions 2311, 2312 and 2313 protrudes from the inner portion 23151 and includes a fourth support surface 2310S having a fourth support position 2310P. The sixth side 232 includes an inner thread structure 2321. When the configuration relationship is the coupling relationship, the lens 10 is disposed on the plurality of first support portions 31, 32 and 33, the plurality of fourth support portions 2311, 2312 and 2313 are disposed on the lens 10, the respective fourth support surface 2310S is opposite to the respective first support surface 30S in relation to the lens 10, and the peripheral thread structure 221 is coupled to the inner thread structure 2321.

Figure 3A:
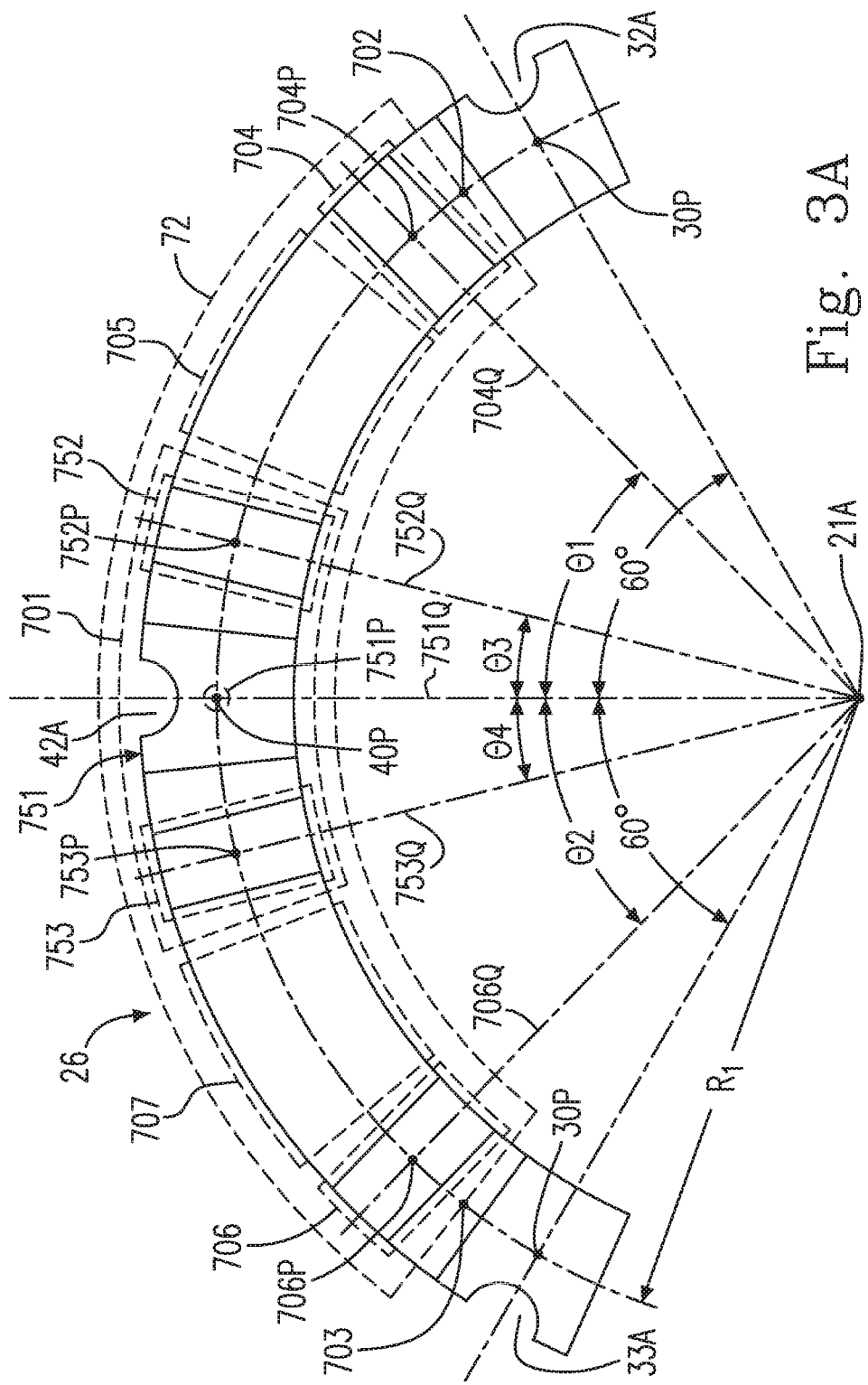
FIG. 3A and FIG. 3B are schematic diagrams respectively showing a partial top view and a partial front view of an implementation structure of the support component according to various embodiments of the present disclosure.
Figure 3B:
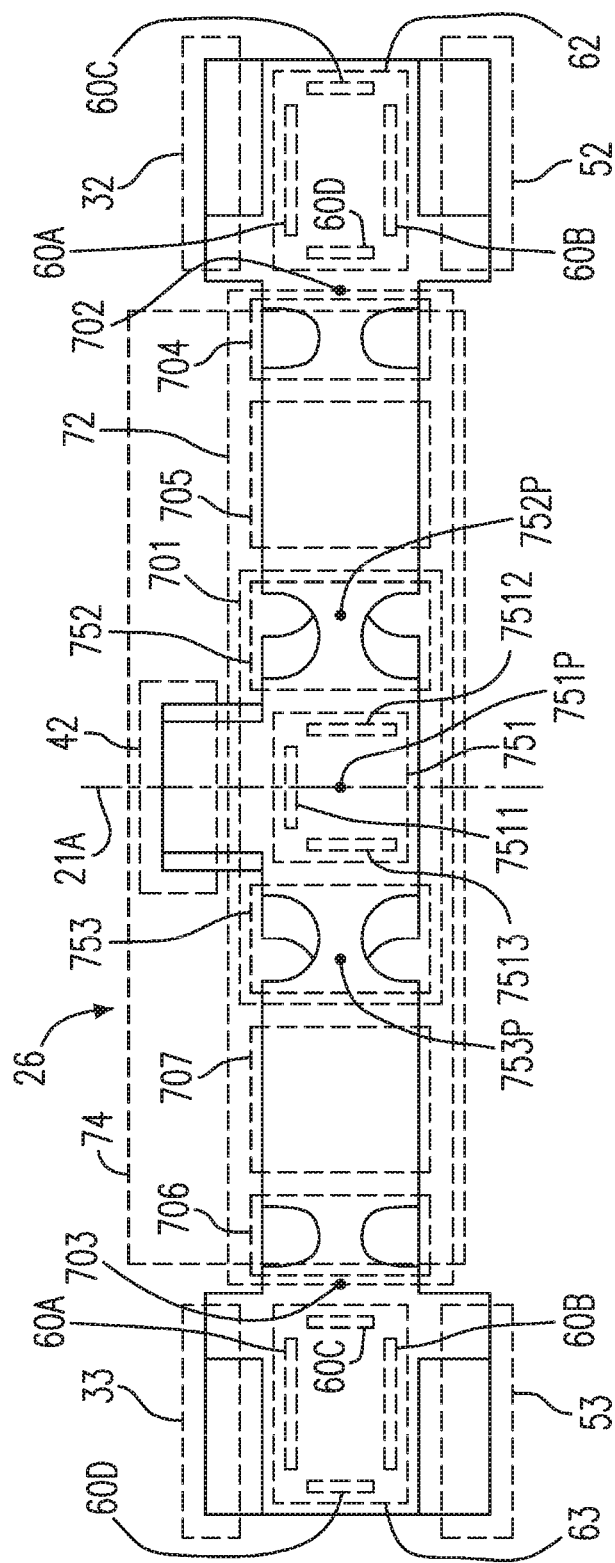

Please refer to FIG. 3A and FIG. 3B, which are schematic diagrams respectively showing a partial top view and a partial front view of an implementation structure 26 of the support component 21 according to various embodiments of the present disclosure. As shown in FIGS. 3A and 3B, each of the plurality of flexible body portions 71, 72 and 73 of the support component 21 further includes a first flexible hinge 704, a first relatively rigid connection portion 705, a second flexible hinge 706 and a second relatively rigid connection portion 707. The first flexible hinge 704 is disposed between the first terminal 702 and the central portion 701; the first relatively rigid connection portion 705 is disposed between the first flexible hinge 704 and the central portion 701; the second flexible hinge 706 is disposed between the central portion 701 and the second terminal 703; and the second relatively rigid connection portion 707 is disposed between the central portion 701 and the second flexible hinge 706.

In some embodiments, the central portion 701 includes a central support block 751, a third flexible hinge 752 coupled to the central support block 751, and a fourth flexible hinge 753 coupled to the central support block 751. The central support block 751 includes a seventh side 7511 coupled to the respective second support portion (such as 42), an eighth side 7512 adjacent to the seventh side 7511, and a ninth side 7513 opposite to the eighth side 7512. The respective second support portion (such as 42) is disposed on the respective seventh side 7511. The third flexible hinge 752 is disposed between the eighth side 7512 and the first relatively rigid connection portion 705. The fourth flexible hinge 753 is disposed between the ninth side 7513 and the second relatively rigid connection portion 707. For instance, the support component 21 is formed as one piece.

In some embodiments, the central support block 751, the first flexible hinge 704, the second flexible hinge 706, the third flexible hinge 752 and the fourth flexible hinge 753 respectively have a first reference position 751P, a second reference position 704P, a third reference position 706P, a fourth reference position 752P and a fifth reference position 753P. The central axis 21A and the first reference position 751P have a first reference plane 751Q therebetween. The central axis 21A and the second reference position 704P have a second reference plane 704Q therebetween. The central axis 21A and the third reference position 706P have a third reference plane 706Q therebetween. The central axis 21A and the fourth reference position 752P have a fourth reference plane 752Q therebetween. The central axis 21A and the fifth reference position 753P have a fifth reference plane 753Q therebetween.

The first and the second reference planes 751Q and 704Q have a first predetermined angle θ1 therebetween to cause the first flexible hinge 704 to be near the first terminal 702. The first and the third reference planes 751Q and 706Q have a second predetermined angle θ2 therebetween to cause the second flexible hinge 706 to be near the second terminal 703. The first and the fourth reference planes 751Q and 752Q have a third predetermined angle θ3 therebetween to cause the third flexible hinge 752 to be near the eighth side 7512. The first and the fifth reference planes 751Q and 753Q have a fourth predetermined angle θ4 therebetween to cause the fourth flexible hinge 753 to be near the ninth side 7513.

As shown in FIGS. 1A, 1B, 1C, 1D, 1E, 1F, 2A, 2B, 3A and 3B, in view of the drawbacks found in the prior art, the support component 21 includes the first, the second, the third and the fourth flexible hinges 704, 706, 752 and 753 according to some embodiments of the present disclosure. The support component 21 uses the first, the second, the third and the fourth flexible hinges 704, 706, 752 and 753 to form an elastic support component, and is manufactured to be formed in one piece to facilitate the manufacture and assembly associated with the support device 20.

In some embodiments, the support device 20 for supporting the lens 10 includes the sleeve 23, the support component 21 and the retainer 22. For instance, the sleeve 23 serves as a sub-cell, forms a lens support body, and can be coupled to an additional sleeve (not shown) to form a lens support combination. The sleeve 23 has an inner portion (such as the inner portion 23151 of the fifth side 231), which includes the three fourth support surfaces 2310S. For instance, the three fourth support surfaces 2310S are respectively three small rigid support faces.

The lens 10 has an outer diameter φ. In some embodiments, the outer diameter φ can be larger than equal to 150 mm to enable the lens 10 to be a large-diameter lens. For instance, in some situations, it is suitable for the support device 20 to support the large-diameter lens. In some embodiments, the support component 21 serves as a load-bearing ring. The three first support surfaces 30S are respectively three small rigid support faces. The three second support surfaces 40S are respectively three small flexible support faces.

For instance, the retainer 22 includes an edge portion having the peripheral thread structure 221, with which the retainer 22 is used for the locking and the load bearing. In the present disclosure, employing only the abovementioned three mechanical components (the sleeve 23, the support component 21 and the retainer 22) can accomplish the technical effect of providing flexible support. In comparison to the common lens support device, which frequently includes tens of components, as disclosed in the prior art, the support device 20 in the present disclosure can be said to have a quite simple design in view of the number of components.

In some embodiments, a lens system including the support device 20 and the lens 10 is shown in FIG. 2B. The three small rigid support faces (such as 2310S) included in the sleeve 23 form three first included angles in relation to the central axis 21A, wherein each of the three first included angles is equal to an angle of 120°. For instance, the dimensions of each of the three small rigid support faces (such as 2310S) are expressed in a rectangle of 4×4 mm. Each of the three small rigid support faces (such as 2310S) has a slope to cause each of the three small rigid support faces (such as 2310S) to be tangent to the surface of the lens 10, thereby reducing the stress applied to the lens 10. For instance, the actual effective contact between the lens 10 and each of the three small rigid support faces (such as 2310S) is a line contact.

The support device 20 has a structure where the three small rigid support faces (such as 30S) included in the support component 21 respectively face the three small rigid support faces (such as 2310S) included in the sleeve 23; in this way, the structure can effectively counteract the clamping forces to avoid generating a torque, can effectively firmly fix the lens 10, and it additionally has a lens centering function. The three-point support in this situation follows the semi-kinematic design, thus does not create over constraint, and thus causes the clamping forces to be counteracted; therefore, when the clamping forces are counteracted, the surface deformation of the lens 10 is mainly caused by the own-gravity deformation. The deformation level of the surface deformation is associated with the weight of the lens 10. The surface deformation can have different deformation levels according to different lens diameters and/or materials. In this situation, if the surface deformation level is measured, a trefoil deformation diagram (not shown) can be obtained to show three deformation depression portions. If it is desirable to further reduce the deformation level, spring forces can be applied to positions of the three deformation depression portions so as to upwardly push the depression portions.

The reasons to apply the spring forces are described as follows. The maximum deformation level on the surface of the lens 10 having the three-point support generally ranges from $(1/3)\lambda$ to $(1/10)\lambda$, when the light wavelength λ is equal to 0.633 μm. Therefore, if rigid bodies serving as pushing elements are put in the positions of the three deformation depression portions shown in the trefoil deformation diagram, stresses generated at the positions can destroy the original three-point support to result in the over constraint, because even the most precise mechanical finishing cannot accomplish the perfect coplanar condition. In the present disclosure, the three second support surfaces 40S included in the support component 21 are respectively three flexible support surfaces; and the spring forces on the three second support surfaces 40S are generated based on the principle of a flexible hinge, and can cause the upwardly pushing supports at the three depression positions of the trefoil deformation formed by the own-gravity of the lens 10.

In some embodiments, when the configuration relationship forms the decoupling relationship, the second height 40H at the second support position 40P is larger than the first height 30H at the first support position 30P by the height difference D1. The height difference D1 depends on the weight of the lens 10 and the elastic modulus of each of the plurality of flexible body portions 71, 72 and 73. When the configuration relationship forms the coupling relationship, the support component 21 generates a spring force through the linear deformation induced by the downwardly applied weight of the lens 10. For instance, when the lens 10 has a first predetermined weight and each of the plurality of flexible body portions 71, 72 and 73 has a predetermined elastic modulus, the height difference D1 is a predetermined height difference. For instance, the predetermined height difference is equal to 0.15 mm. The first support position 30P is a predetermined representative contact position on the first support surface 30S. The second support position 40P is a predetermined representative contact position on the second support surface 40S. The third support position 50P is a predetermined representative contact position on the third support surface 50S. The fourth support position 2310P is a predetermined representative contact position on the fourth support surface 40S.

When the configuration relationship is the coupling relationship, a respective first clamping force occurring at the respective first support position 30P counteracts a respective second clamping force occurring at the respective fourth support position 2310P, and the respective spring force is used to resist the deformation induced by the gravity of the lens 10. At this time, the support for the gravity of the lens 10 is changed from the three-point even distribution support in the original state to the six-point even distribution support, so that the maximum surface deformation of the lens 10 can be effectively reduced. For instance, when the lens 10 is only supported at the three rigid support positions (such as 30P), a maximum surface deformation level formed on the surface of the lens 10 is $(1/10)\lambda$, wherein the light wavelength $\lambda$ is equal to 0.633 μm; therefore, when the lens 10 is supported at the three rigid support positions (such as 30P) and at the three flexible support positions (such as 40P), a maximum surface deformation level formed on the surface of the lens 10 can be reduced to a lower level between $(1/10)\lambda$ and $(1/20)\lambda$. Specifically, the threshold TH1 is equal to a value between $(1/10)\lambda$ and $(1/20)\lambda$.

In some embodiments, the support device 20 serves as a lens-mounting device having a vertical-setup structure. A lens in a common exposure apparatus (where the resolution dimension is less than 1 μm) is an example of this structure. Therefore, the support device 20 can be applied to the support of a functional element 15 for one of quite various types of elements. For instance, the functional element 15 is an optical element. The support device 20 is included in an exposure apparatus. In some embodiments, the three rigid support positions (30P) included in the support component 21 form three second included angles in relation to the central axis 21A, wherein each of the three second included angles is equal to an angle of 120°. The three flexible support positions (40P) included in the support component 21 form three third included angles in relation to the central axis 21A, wherein each of the three third included angles is equal to an angle of 120°. The respective rigid support positions (30P) and the respective flexible support positions (40P) adjacent to the respective rigid support positions (30P) form a fourth included angle in relation to the central axis 21A, wherein the fourth included angle is equal to an angle of 60°.

In some embodiments, the support device 20 uses the three first support surfaces (30S) on the upper side and the three fourth support surfaces (2310S) on the lower side to clamp the lens 10 so as to locate the lens 10, thereby accomplishing the functions including stress counteraction and aligning the central axis of the lens 10 with the central axis 21A of the support component 21. The support device 20 uses the first, the second, the third and the fourth flexible hinges 704, 706, 752 and 753 included in the support component 21 to form the spring forces that support the lens 10. The spring forces are configured to counteract the residual own-gravity deformation caused by the three-point support, thereby accomplishing the effect of minimizing the surface deformation of the lens 10.

In some embodiments, a flexible hinge can be applied in the precise mechanical industry. For instance, a micromotion platform can be moved by the deformation of the flexible hinge. The advantages of this motion platform include the avoidance of traditional mechanical motion problems associated with friction, loss, gear backlash, and so forth.

Figure 4:
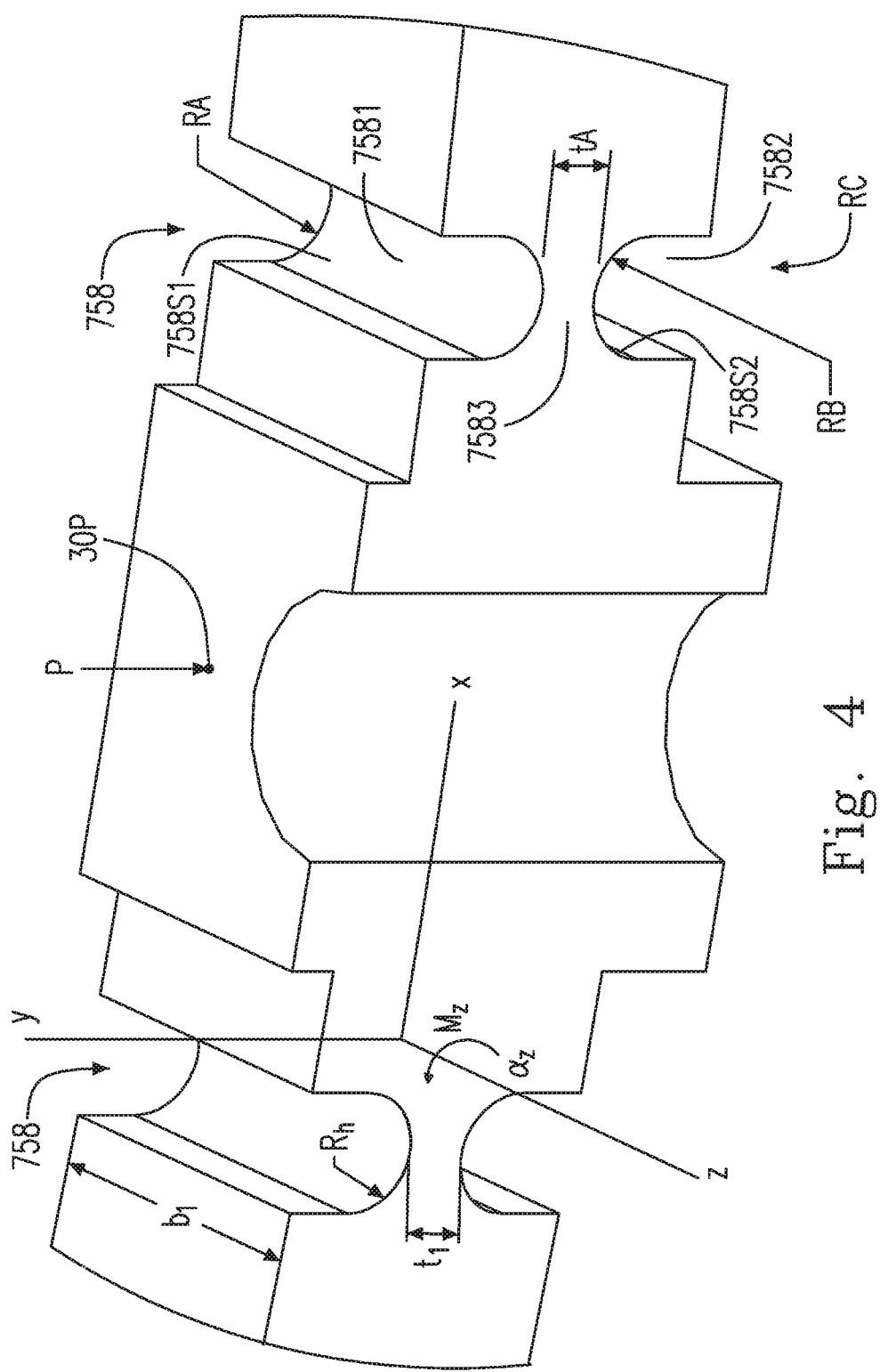
FIG. 4 is a schematic diagram showing a three-dimensional view of a flexible hinge of the support component according to various embodiments of the present disclosure.

Please refer to FIG. 4, which is a schematic diagram showing a three-dimensional view of a flexible hinge 758 of the support component 21 according to various embodiments of the present disclosure. The structure of each of the first, the second, the third and the fourth flexible hinges 704, 706, 752 and 753 is similar to that of the flexible hinge 758. As shown in FIG. 4, the flexible hinge 758 includes a first trench 7581, a second trench 7582 opposite to the first trench 7581, and a neck 7583 formed between the first and the second trenches 7581 and 7582. The neck 7583 has a neck thickness tA, a first curved surface 758S1 formed by the first trench 7581, and a second curved surface 758S2 formed by the second trench 7582. The first and the second curved surfaces 758S1 and 758S2 respectively have a first curvature radius RA and a second curvature radius RB. The flexibility characteristics of the flexible hinge 758 depend on the ratio tA/RA and the ratio tA/RB.

For instance, each of the first and the second curvature radiuses RA and RB is equal to a third curvature radius RC; in this way, a ratio tA/RC of the neck thickness tA to the third curvature radius can be configured through an optimum calculation to estimate the spring force necessary to support the lens 10. When the configuration relationship forms the decoupling relationship, the second support surface 40S (or the second support position 40P) is larger than the first support surface 30S (or the first support position 30P) by the height difference D1. The support device 20 and the lens 10 are assembled to cause the configuration relationship to form the coupling relationship. When the configuration relationship is the coupling relationship, the absolute difference value AD1 between the first and the second heights 30H and 40H is less than the threshold TH1, and the linear deformation of the support beam 74 can form a spring force, wherein the strength of the spring force is proportional to the predetermined height difference (D1). For instance, through a change of the predetermined height difference (D1), the spring force can be controlled to avoid causing over constraint so as to accomplish an effect of reducing the own-gravity deformation. For instance, the support component 21 is formed of one piece; and in comparison to the conventional lens support device having complex mechanical components, the support component 21 has advantages including simplicity in manufacturing and assembly, and low cost, and can easily be made using mass production.

In some embodiments, the height difference D1 is proportional to a theoretical protrusion value $\delta_1$. The theoretical protrusion value $\delta_1$ satisfies the equation: $\delta_1 = (3/16)R_1^2(\alpha_z/M_z)P$, wherein the $\alpha_z/M_z$ satisfies the following equation:

$$\frac{\alpha_z}{M_z} = \left\{ \frac{E_1 b_1 t_1^2}{12} \left[ -0.0089 + 1.3556 \sqrt{\frac{t_1}{2R_h}} - 0.5227 \left( \frac{t_1}{2R_h} \right) \right] \right\}^{-1},$$

wherein the reference character $R_1$ represents a radius from each of the plurality of flexible body portions 71, 72 and 73 to the optical axis center of the lens 10; the reference character $\alpha_z$ represents a flexure angle in the z direction; the reference character $M_z$ represents a moment of force in the z direction; the reference character P represents a weight on each of the support surfaces associated with the lens 10; the reference character $E_1$ represents a Young's modulus (or an elastic modulus) of each of the plurality of flexible body portions 71, 72 and 73; the reference character $b_1$ represents a width of the flexible hinge 758; the reference character $t_1$ represents a thickness of the flexible hinge 758; and the reference character $R_h$ represents a radius of the flexible hinge 758. Also, each of the plurality of flexible body portions 71, 72 and 73 has a central reference arc in relation to the central axis 21A, wherein the central reference arc has the radius $R_1$.

Figure 5A:
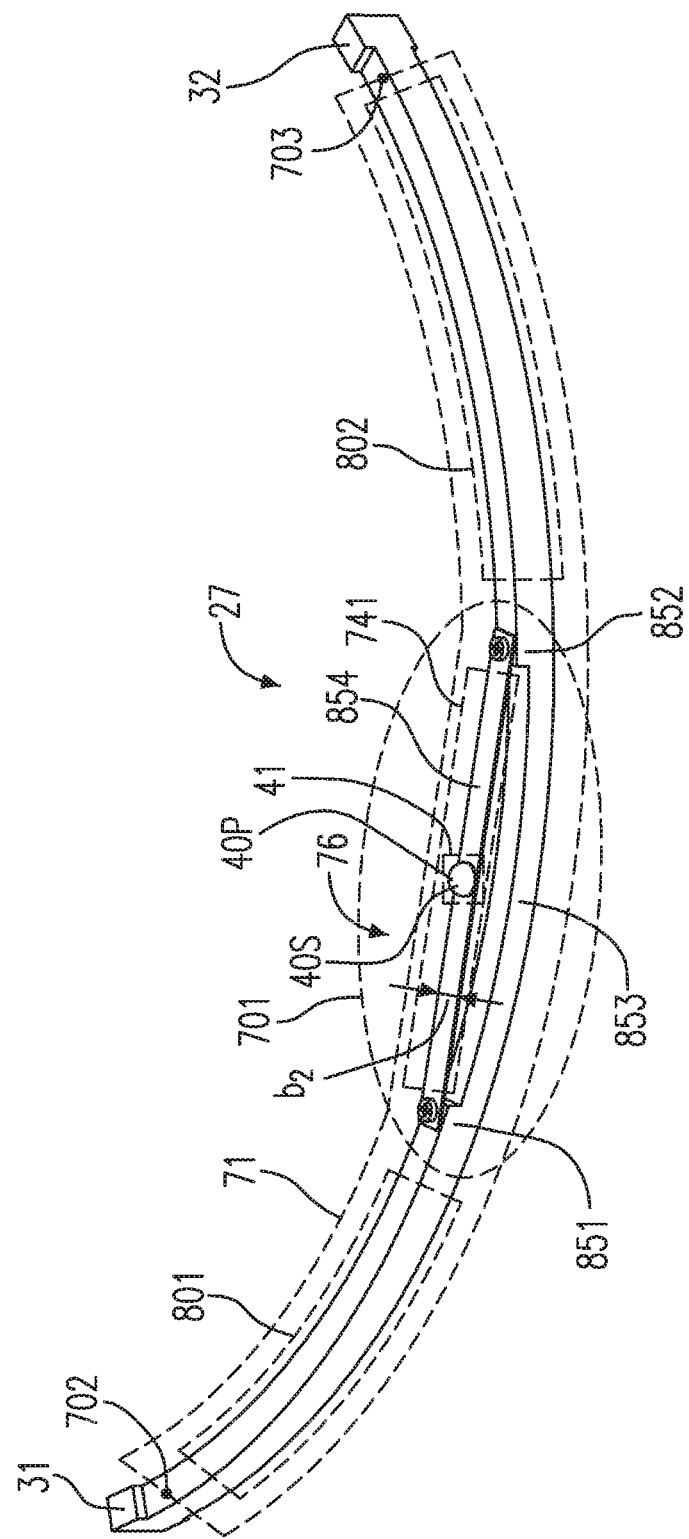
FIG. 5A is a schematic diagram showing a partial three-dimensional view of an implementation structure of the support component according to various embodiments of the present disclosure.

Please refer to FIG. 5A, FIG. 5B and FIG. 5C. FIG. 5A is a schematic diagram showing a partial three-dimensional view of an implementation structure 27 of the support component 21 according to various embodiments of the present disclosure. FIGS. 5B and 5C are schematic diagrams respectively showing cross-sectional views of an implementation structure 76 of the central portion 701 of the support component 21 according to various embodiments of the present disclosure. As shown in FIGS. 5A, 5B and 5C, each (such as 71) of the plurality of flexible body portions 71, 72 and 73 further includes a first relatively rigid connection portion 801 disposed between the respective first terminal 702 and the respective central portion 701, and a second relatively rigid connection portion 802 disposed between the respective central portion 701 and the respective second terminal 703.

In some embodiments, each the respective central portion 701 includes a first terminal portion 851, a second terminal portion 852, a relatively rigid body portion 853 and a flexible unit 854. The first terminal portion 851 is coupled to the respective first relatively rigid connection portion 801. The second terminal portion 852 is coupled to the respective second relatively rigid connection portion 802. The relatively rigid body portion 853 is disposed between the respective first and the respective second terminal portions 851 and 852. The flexible unit 854 is disposed between the respective first and the respective second terminal portions 851 and 852, is located above the respective relatively rigid body portion 853, forms a flexible plate, and includes a third terminal portion 8541 and a fourth terminal portion 8542 opposite to the third terminal portion 8541. The third and the fourth terminal portions 8541 and 8542 are respectively coupled to the respective first and the respective second terminal portions 851 and 852. The flexible unit 854 and the respective second support portion (such as 41) constitute a flexible beam 741 included in the support beam 74.

In addition, the flexible unit 854 and the relatively rigid body portion 853 have a gap 855 therebetween. The flexible unit 854 further includes a first surface 8543 opposite to the relatively rigid body portion 853, and a second surface 8544 opposite to the first surface 8543. For instance, the first surface 8543 faces the relatively rigid body portion 853. The respective second support portion (such as 41) is disposed on the second surface 8544 of the flexible unit 854. The first and the second terminal portions 851 and 852 respectively include a first support structure 8511 and a second support structure 8521. The first support structure 8511 and the third terminal portion 8541 have a first connection relationship therebetween to cause the first support structure 8511 to support the third terminal portion 8541. The second support structure 8521 and the fourth terminal portion 8542 have a second connection relationship therebetween to cause the second support structure 8521 to support the fourth terminal portion 8542, wherein the second connection relationship corresponds to the first connection relationship;

The first connection relationship is one selected from a plurality of predetermined relationships including a first predetermined relationship, a second predetermined relationship and a third predetermined relationship. The central portion 701 exists in one selected from a group consisting of a first state, a second state and a third state respectively associated with the first, the second and the third predetermined relationships. In the first state, the first support structure 8511 includes a first thread component 85111, which causes the first support structure 8511 and the third terminal portion 8541 to join together to form the first predetermined relationship. For instance, the second support structure 8521 includes a second thread component 85211, which causes the second support structure 8521 and the fourth terminal portion 8542 to join together to form a fourth predetermined relationship corresponding to the first predetermined relationship.

In some embodiments, in the first state, the height difference D1 is proportional to a theoretical protrusion value $\delta_2$. The theoretical protrusion value $\delta_2$ satisfies the equation: $\delta_2 = (PL_2^3)/(16E_2 b_2 t_2^3)$, wherein the reference character P represents a weight on each of the support surfaces associated with the lens 10; the reference character $L_2$ represents a length of the flexible unit 854; the reference character $E_2$ represents a Young's modulus (or an elastic modulus) of the flexible unit 854; the reference character $b_2$ represents a width of the flexible unit 854; and the reference character $t_2$ represents a thickness of the flexible unit 854. For instance, in one specific condition, the height difference D1 is equal to 0.77 mm.

Figure 6:
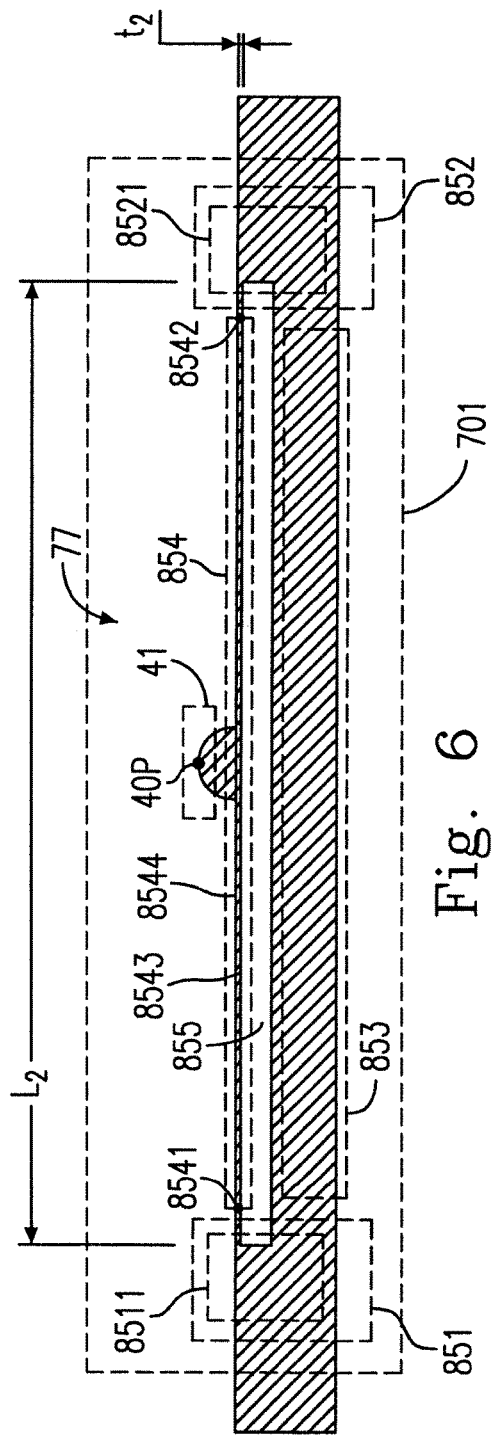
FIG. 6 is a schematic diagram showing a cross-sectional view of an implementation structure of the central portion of the support component according to various embodiments of the present disclosure.

Please refer to FIG. 6, which is a schematic diagram showing a cross-sectional view of an implementation structure 77 of the central portion 701 of the support component 21 according to various embodiments of the present disclosure. As shown in FIG. 6, in the second state, the first support structure 8511 and the third terminal portion 8541 are configured as one piece to form the second predetermined relationship. In the second state, the height difference D1 is proportional to the theoretical protrusion value $\delta_2$. The second support structure 8521 and the fourth terminal portion 8542 are configured as one piece to form a fifth predetermined relationship corresponding to the second predetermined relationship.

Figure 7:
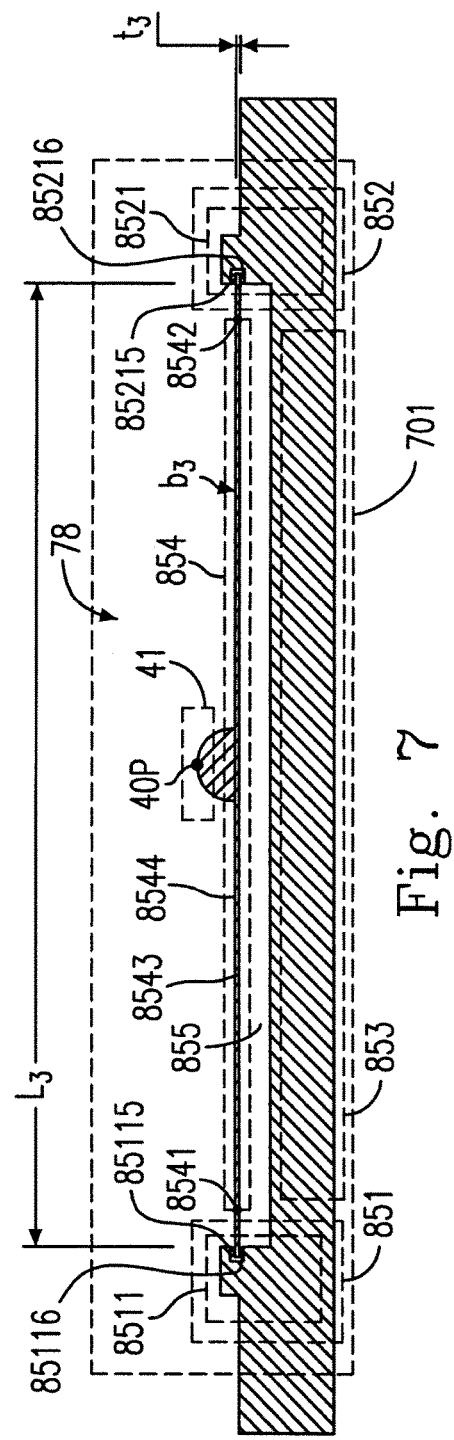
FIG. 7 is a schematic diagram showing a cross-sectional view of an implementation structure of the central portion of the support component according to various embodiments of the present disclosure.

Please refer to FIG. 7, which is a schematic diagram showing a cross-sectional view of an implementation structure 78 of the central portion 701 of the support component 21 according to various embodiments of the present disclosure. As shown in FIG. 7, in the third state, the first support structure 8511 includes a first constraint portion 85115 and a second constraint portion 85116 opposite to the first constraint portion 85115, and uses the first and the second constraint portions 85115 and 85116 to constrain the third terminal portion 8541 to form the third predetermined relationship. Specifically, the first and the second constraint portions 85115 and 85116 respectively form a first semi-sphere and a second semi-sphere. In the third state, because each of the first and the second support structures 8511 and 8521 does not include a thread component to lock the flexible unit 854 through penetration, when the flexible unit 854 supports the lens 10, the flexible unit 854 can slide on any of the first and the second support structure 8511 and 8521 and deform. Also, the second support structure 8521 includes a third constraint portion 85215 and a fourth constraint portion 85216 opposite to the third constraint portion 85215, and uses the third and the fourth constraint portions 85215 and 85216 to constrain the fourth terminal portion 8542 to form a sixth predetermined relationship corresponding to the third predetermined relationship.

In some embodiments, in the third state, the height difference D1 is proportional to a theoretical protrusion value $\delta_3$. The theoretical protrusion value $\delta_3$ satisfies the equation: $\delta_3 = (PL_3^3)/(4E_3 b_3 t_3^3)$, wherein the reference character P represents a weight on each of the support surfaces associated with the lens 10; the reference character $L_3$ represents a length of the flexible unit 854; the reference character $E_3$ represents a Young's modulus (or an elastic modulus) of the flexible unit 854; the reference character $b_3$ represents a width of the flexible unit 854; and the reference character $t_3$ represents a thickness of the flexible unit 854.

Based on the illustrations in FIGS. 1A-7, a support method for supporting a lens 10 is disclosed. In some embodiments, the support method includes the following steps. A support component 21 is provided, wherein the support component 21 includes a main body 211, a plurality of first support portions 31, 32 and 33 disposed on the main body 211, and a plurality of second support portions 41, 42 and 43 disposed on the main body 211, each of the plurality of first support portions 31, 32 and 33 has a first support position 30P thereon having a first height 30H, and is configured to rigidly support the lens 10, and each (such as 42) of the plurality of second support portions 41, 42 and 43 is disposed between respective adjacent two (such as 32 and 33) of the plurality of first support portions 31, 32 and 33, has a second support position 40P thereon having a second height 40H, and is configured to flexibly support the lens 10. When a configuration relationship between the support component 21 and the lens 10 forms a decoupling relationship, the second height 40H is caused to be larger than the first height 30H. When the configuration relationship is changed to a coupling relationship, an absolute difference value AD1 between the first and the second heights 30H and 40H is caused to be less than a threshold TH1.

In some embodiments, each of the plurality of first support portions 31, 32 and 33 protrudes from the main body 211, and includes a first support surface 30S having the first support position 30S. Each of the plurality of second support portions 41, 42 and 43 protrudes from the main body 211, and includes a second support surface 40S having the second support position 40P. The support component 21 further includes a plurality of third support portions 51, 52 and 53 correspondingly opposite to the plurality of first support portions 31, 32 and 33 in relation to the main body 211. Each of the plurality of third support portions 51, 52 and 53 protrudes from the main body 211, and includes a third support surface 50S having a third support position 50P, and the first support surface 30S is opposite to the third support surface 50S in relation to the main body 211.

In some embodiments, the support method further includes steps of: providing a retainer 22; and providing a sleeve 23. The retainer 22 includes a peripheral thread structure 221. The sleeve 23 includes a fifth side 231 and a sixth side 232 opposite to the fifth side 231. The fifth side 231 includes a first body 2315, and a plurality of fourth support portions 2311, 2312 and 2313. The first body 2315 has an inner portion 23151. Each (such as 2311) of the plurality of fourth support portions 2311, 2312 and 2313 is configured to be coupled to the lens 10, corresponds to a respective one (such as 31) of the plurality of first support portions 31, 32 and 33, protrudes from the inner portion 23151, and includes a fourth support surface 2310S having a fourth support position 2310P. The sixth side 232 includes an inner thread structure 2321.

In some embodiments, the support method further includes steps of when the configuration relationship forms the coupling relationship: causing the support component 21 to be disposed on the retainer 22 by using the plurality of third support portions 51, 52 and 53; causing the lens 10 to be disposed on the plurality of first support portions 31, 32 and 33 and on the plurality of second support portions 41, 42 and 43; causing the sleeve 23 to be disposed on the lens 10 by using the plurality of fourth support portions 2311, 2312 and 2313, wherein the respective fourth support surface 2310S is opposite to the respective first support surface 30S in relation to the lens 10; and causing the retainer 22 to couple to the sleeve 23 by coupling the peripheral thread structure 221 to the inner thread structure 2321.

Based on the illustrations in FIGS. 1A-7, a support component 91 for supporting a functional element 15 is disclosed. In some embodiments, the support component 91 includes a main body 211, a plurality of first support portions 31, 32 and 33, and a plurality of second support portions 41, 42 and 43. The plurality of first support portions 31, 32 and 33 are disposed on the main body 211, wherein each of the plurality of first support portions 31, 32 and 33 has a first support position 30P thereon having a first height 30H, and is configured to rigidly support the functional element 15. The plurality of second support portions 41, 42 and 43 are disposed on the main body 211, wherein each (such as 42) of the plurality of second support portions 41, 42 and 43 is disposed between respective adjacent two (such as 32 and 33) of the plurality of first support portions 31, 32 and 33, has a second support position 40P thereon having a second height 40H, and is configured to flexibly support the functional element 15. When a configuration relationship between the support component 91 and the functional element 15 is a decoupling relationship, the second height 40H is larger than the first height 30H. When the configuration relationship is a coupling relationship, an absolute difference value AD1 between the first and the second heights 30H and 40H is less than a threshold TH1.

In some embodiments, the functional element 15 has a specific function being one selected from a plurality of predetermined functions. The plurality of predetermined functions include a light using function, a force using function and an electricity using function. When the specific function is the light using function, the functional element 15 is an optical element. When the specific function is the force using function, the functional element 15 is a mechanical element. When the specific function is the electricity using function, the functional element 15 is an electrical/electronic element. For instance, when the specific function is the light using function and the light using function is a light transmission function, the functional element 15 is a lens 10. The support component 91 is included in a support device 90. For instance, the support device 90 further includes a retainer 22 and a sleeve 23. When the configuration relationship is a coupling relationship, the functional element 15 is disposed on the retainer 22, the retainer 22 is coupled to the sleeve 23, and the sleeve 23 and the support component 91 clamp the functional element 15 in different directions. The functional element 15 further has a predetermined structure, so that the coupling relationship between the support component 91 and the functional element 15 can be calculated.

While the invention has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A support device for supporting a lens, the support device comprising:
   a support component comprising:
      a main body;
      a plurality of first support portions disposed on the main body, wherein each of the plurality of first support portions has a first support position thereon having a first height, and is configured to rigidly support the lens; and
      a plurality of second support portions disposed on the main body, wherein each of the plurality of second support portions is disposed between respective adjacent two of the plurality of first support portions, has a second support position thereon having a second height, and is configured to flexibly support the lens, wherein:
   when a configuration relationship between the support component and the lens becomes a decoupling relationship, the second height is larger than the first height; and
   when the configuration relationship is changed to a coupling relationship, an absolute difference value between the first and the second heights is less than a threshold.

2. The support device according to claim 1, wherein:
   each of the plurality of first support portions includes a first support surface having the first support position;
   each of the plurality of second support portions includes a second support surface having the second support position;
   the plurality of first support positions are evenly spaced to form a first polar support position array;
   the plurality of second support positions are evenly spaced to form a second polar support position array;
   the support component supports the lens to form the coupling relationship, and further comprises a plurality of third support portions respectively opposite to the plurality of first support portions in relation to the main body, wherein each of the plurality of third support portions rigidly supports the main body, and includes a third support surface having a third support position, and the first support surface is opposite to the third support surface in relation to the main body;
   the main body forms a ring, and includes a plurality of rigid body portions and a plurality of flexible body portions, wherein each of the plurality of flexible body portions and a corresponding one of the plurality of second support portions constitute a support beam;
   the plurality of first support portions are respectively disposed on the plurality of rigid body portions, and the plurality of rigid body portions are respectively disposed on the plurality of third support portions;
   each of the plurality of rigid body portions includes a first side, a second side opposite to the first side, a third side adjacent to the first and the second sides, and a fourth side opposite to the third side;
   the respective first support portion is disposed on the respective first side, and the respective third support portion is coupled to the respective second side;
   the plurality of second support portions are respectively disposed on the plurality of flexible body portions, each of which includes a central portion, a first terminal in relation to the central portion, and a second terminal opposite to the first terminal;
   the respective second support portion is disposed on the respective central portion; and
   each of the plurality of flexible body portions is disposed between respective adjacent two of the plurality of rigid body portions, wherein the respective first terminal is coupled to the respective fourth side of one of respective adjacent two of the plurality of rigid body portions, and the respective second terminal is coupled to the respective third side of the other of the respective adjacent two of the plurality of rigid body portions.

3. The support device according to claim 2, further comprising:
   a retainer including a peripheral thread structure, wherein when the configuration relationship is the coupling relationship, the support component is disposed on the retainer by using the plurality of third support portions; and
   a sleeve including a fifth side and a sixth side opposite to the fifth side, wherein:
   the fifth side includes a first body and a plurality of fourth support portions, wherein the first body has an inner portion, and each of the plurality of fourth support portions is configured to be coupled to the lens, corresponds to a respective one of the plurality of first support portions, protrudes from the inner portion and includes a fourth support surface having a fourth support position;
   the sixth side includes an inner thread structure; and
   when the configuration relationship is the coupling relationship, the lens is disposed on the plurality of first support portions and on the plurality of second support portions, the plurality of fourth support portions are disposed on the lens, the respective fourth support surface is opposite to the respective first support surface in relation to the lens, and the peripheral thread structure is coupled to the inner thread structure.

4. The support device according to claim 2, wherein:
   each of the plurality of flexible body portions further includes a first flexible hinge, a first relatively rigid connection portion, a second flexible hinge and a second relatively rigid connection portion, wherein the first flexible hinge is disposed between the first terminal and the central portion, the first relatively rigid connection portion is disposed between the first flexible hinge and the central portion, the second flexible hinge is disposed between the central portion and the second terminal, and the second relatively rigid connection portion is disposed between the central portion and the second flexible hinge;

the central portion includes a central support block, a third flexible hinge coupled to the central support block, and a fourth flexible hinge coupled to the central support block;

the central support block includes a seventh side coupled to the respective second support portion, an eighth side adjacent to the seventh side, and a ninth side opposite to the eighth side;

the respective second support portion is disposed on the respective seventh side;

the third flexible hinge is disposed between the eighth side and the first relatively rigid connection portion;

the fourth flexible hinge is disposed between the ninth side and the second relatively rigid connection portion;

the support component further includes a central axis, a plurality of first outer locating notches respectively corresponding to the plurality of first support portions, and a plurality of second outer locating notches respectively corresponding to the plurality of second support portions;

each of the plurality of first outer locating notches has a portion formed on a respective one of the plurality of first support portions; and each of the plurality of second outer locating notches has a portion formed on a respective one of the plurality of second support portions.

5. The support device according to claim 4, wherein:

the central support block, the first flexible hinge, the second flexible hinge, the third flexible hinge and the fourth flexible hinge respectively have a first reference position, a second reference position, a third reference position, a fourth reference position and a fifth reference position;

the central axis and the first reference position have a first reference plane therebetween, the central axis and the second reference position have a second reference plane therebetween, the central axis and the third reference position have a third reference plane therebetween, the central axis and the fourth reference position have a fourth reference plane therebetween, and the central axis and the fifth reference position have a fifth reference plane therebetween;

the first and the second reference planes have a first predetermined angle therebetween to cause the first flexible hinge to be near the first terminal;

the first and the third reference planes have a second predetermined angle therebetween to cause the second flexible hinge to be near the second terminal;

the first and the fourth reference planes have a third predetermined angle therebetween to cause the third flexible hinge to be near the eighth side;

the first and the fifth reference planes have a fourth predetermined angle therebetween to cause the fourth flexible hinge to be near the ninth side; and the support component is formed as one piece.

6. The support device according to claim 2, wherein:

each of the plurality of flexible body portions further includes a first relatively rigid connection portion disposed between the respective first terminal and the respective central portion, and a second relatively rigid connection portion disposed between the respective central portion and the respective second terminal;

each the respective central portion includes:
  a first terminal portion coupled to the respective first relatively rigid connection portion;
  a second terminal portion coupled to the respective second relatively rigid connection portion;
  a relatively rigid body portion disposed between the respective first and the respective second terminal portions; and
  a flexible unit disposed between the respective first and the respective second terminal portions, located above the respective relatively rigid body portion, forming a flexible plate, and including a third terminal portion and a fourth terminal portion opposite to the third terminal portion, wherein the third and the fourth terminal portions are respectively coupled to the respective first and the respective second terminal portions, and the flexible unit and the respective second support portion constitute a flexible beam included in the support beam;

the flexible unit and the relatively rigid body portion have a gap therebetween;

the flexible unit further includes a first surface opposite to the relatively rigid body portion, and a second surface opposite to the first surface; and the respective second support portion is disposed on the second surface of the flexible unit.

7. The support device according to claim 6, wherein:

the first and the second terminal portions respectively include a first support structure and a second support structure;

the first support structure and the third terminal portion have a first connection relationship therebetween to cause the first support structure to support the third terminal portion;

the second support structure and the fourth terminal portion have a second connection relationship therebetween to cause the second support structure to support the fourth terminal portion, wherein the second connection relationship corresponds to the first connection relationship;

the first connection relationship is one selected from a group consisting of a first predetermined relationship, a second predetermined relationship and a third predetermined relationship;

the central portion exists in one selected from a group consisting of a first state, a second state and a third state respectively associated with the first, the second and the third predetermined relationships;

in the first state, the central portion further includes a thread component causing the first support structure and the third terminal portion to join together to form the first predetermined relationship;

in the second state, the first support structure and the third terminal portion are configured as one piece to form the second predetermined relationship; and in the third state, the first support structure includes a first constraint portion and a second constraint portion opposite to the first constraint portion, and uses the first and the second constraint portions to constrain the third terminal portion to form the third predetermined relationship.

8. A support method for supporting a lens, the support method comprising steps of:

providing a support component, wherein:
  the support component includes a main body, a plurality of first support portions disposed on the main body, and a plurality of second support portions disposed on the main body,
  each of the plurality of first support portions has a first support position thereon having a first height, and is configured to rigidly support the lens, and each of the plurality of second support portions is disposed between respective adjacent two of the plurality of first support portions, has a second support position thereon having a second height, and is configured to flexibly support the lens;

when a configuration relationship between the support component and the lens forms a decoupling relationship, causing the second height to be larger than the first height; and when the configuration relationship is changed to a coupling relationship, causing an absolute difference value between the first and the second heights to be less than a threshold.

9. The support method according to claim 8, wherein:

each of the plurality of first support portions includes a first support surface having the first support position;

each of the plurality of second support portions includes a second support surface having the second support position;

the plurality of first support positions are evenly spaced to form a first polar support position array;

the plurality of second support positions are evenly spaced to form a second polar support position array;

the support component supports the lens to form the coupling relationship, and further includes a plurality of third support portions respectively opposite to the plurality of first support portions in relation to the main body, wherein each of the plurality of third support portions rigidly supports the main body, and includes a third support surface having a third support position, and the first support surface is opposite to the third support surface in relation to the main body;

the main body forms a ring, and includes a plurality of rigid body portions and a plurality of flexible body portions, wherein each of the plurality of flexible body portions and a corresponding one of the plurality of second support portions constitute a support beam;

the plurality of first support portions are respectively disposed on the plurality of rigid body portions, and the plurality of rigid body portions are respectively disposed on the plurality of third support portions;

each of the plurality of rigid body portions includes a first side, a second side opposite to the first side, a third side adjacent to the first and the second sides, and a fourth side opposite to the third side;

the respective first support portion is disposed on the respective first side, and the respective third support portion is coupled to the respective second side;

the plurality of second support portions are respectively disposed on the plurality of flexible body portions, each of which includes a central portion, a first terminal in relation to the central portion, and a second terminal opposite to the first terminal;

the respective second support portion is disposed on the respective central portion; and each of the plurality of flexible body portions is disposed between respective adjacent two of the plurality of rigid body portions, wherein the respective first terminal is coupled to the respective fourth side of one of respective adjacent two of the plurality of rigid body portions, and the respective second terminal is coupled to the respective third side of the other of the respective adjacent two of the plurality of rigid body portions.

10. The support method according to claim 9, further comprising steps of:

providing a retainer including a peripheral thread structure;

providing a sleeve including a fifth side and a sixth side opposite to the fifth side, wherein:

the fifth side includes a first body and a plurality of fourth support portions, wherein the first body has an inner portion, and each of the plurality of fourth support portions is configured to be coupled to the lens, corresponds to a respective one of the plurality of first support portions, protrudes from the inner portion and includes a fourth support surface having a fourth support position; and the sixth side includes an inner thread structure; and when the configuration relationship forms the coupling relationship, causing the support component to be disposed on the retainer by using the plurality of third support portions;

causing the lens to be disposed on the plurality of first support portions and on the plurality of second support portions;

causing the sleeve to be disposed on the lens by using the plurality of fourth support portions, wherein the respective fourth support surface is opposite to the respective first support surface in relation to the lens; and causing the retainer to couple to the sleeve by coupling the peripheral thread structure to the inner thread structure.

11. The support method according to claim 9, wherein:

each of the plurality of flexible body portions further includes a first flexible hinge, a first relatively rigid connection portion, a second flexible hinge and a second relatively rigid connection portion, wherein the first flexible hinge is disposed between the first terminal and the central portion, the first relatively rigid connection portion is disposed between the first flexible hinge and the central portion, the second flexible hinge disposed between the central portion and the second terminal, and the second relatively rigid connection portion is disposed between the central portion and the second flexible hinge;

the central portion includes a central support block, a third flexible hinge coupled to the central support block, and a fourth flexible hinge coupled to the central support block;

the central support block includes a seventh side coupled to the respective second support portion, an eighth side adjacent to the seventh side, and a ninth side opposite to the eighth side;

the respective second support portion is disposed on the respective seventh side;

the third flexible hinge is disposed between the eighth side and the first relatively rigid connection portion;

the fourth flexible hinge is disposed between the ninth side and the second relatively rigid connection portion;

the support component further includes a central axis, a plurality of first outer locating notches respectively corresponding to the plurality of first support portions, and a plurality of second outer locating notches respectively corresponding to the plurality of second support portions;

each of the plurality of first outer locating notches has a portion formed on a respective one of the plurality of first support portions; and each of the plurality of second outer locating notches has a portion formed on a respective one of the plurality of second support portions.

12. The support method according to claim 11, wherein:
the central support block, the first flexible hinge, the second flexible hinge, the third flexible hinge and the fourth flexible hinge respectively have a first reference position, a second reference position, a third reference position, a fourth reference position and a fifth reference position;
the central axis and the first reference position have a first reference plane therebetween, the central axis and the second reference position have a second reference plane therebetween, the central axis and the third reference position have a third reference plane therebetween, the central axis and the fourth reference position have a fourth reference plane therebetween, and the central axis and the fifth reference position have a fifth reference plane therebetween;
the first and the second reference planes have a first predetermined angle therebetween to cause the first flexible hinge to be near the first terminal;
the first and the third reference planes have a second predetermined angle therebetween to cause the second flexible hinge to be near the second terminal;
the first and the fourth reference planes have a third predetermined angle therebetween to cause the third flexible hinge to be near the eighth side;
the first and the fifth reference planes have a fourth predetermined angle therebetween to cause the fourth flexible hinge to be near the ninth side; and
the support component is formed as one piece.

13. The support method according to claim 9, wherein:
each of the plurality of flexible body portions further includes a first relatively rigid connection portion disposed between the respective first terminal and the respective central portion, and a second relatively rigid connection portion disposed between the respective central portion and the respective second terminal;
each the respective central portion includes:
  a first terminal portion coupled to the respective first relatively rigid connection portion;
  a second terminal portion coupled to the respective second relatively rigid connection portion;
  a relatively rigid body portion disposed between the respective first and the respective second terminal portions; and
  a flexible unit disposed between the respective first and the respective second terminal portions, located above the respective relatively rigid body portion, forming a flexible plate, and including a third terminal portion and a fourth terminal portion opposite to the third terminal portion, wherein the third and the fourth terminal portions are respectively coupled to the respective first and the respective second terminal portions, and the flexible unit and the respective second support portion constitute a flexible beam included in the support beam;
the flexible unit and the relatively rigid body portion have a gap therebetween;
the flexible unit further includes a first surface opposite to the relatively rigid body portion, and a second surface opposite to the first surface; and
the respective second support portion is disposed on the second surface of the flexible unit.

14. The support method according to claim 13, wherein:
the first and the second terminal portions respectively include a first support structure and a second support structure;
the first support structure and the third terminal portion have a first connection relationship therebetween to cause the first support structure to support the third terminal portion;
the second support structure and the fourth terminal portion have a second connection relationship therebetween to cause the second support structure to support the fourth terminal portion, wherein the second connection relationship corresponds to the first connection relationship;
the first connection relationship is one selected from a group consisting of a first predetermined relationship, a second predetermined relationship and a third predetermined relationship;
the central portion exists in one selected from a group consisting of a first state, a second state and a third state respectively associated with the first, the second and the third predetermined relationships;
in the first state, the central portion further includes a thread component causing the first support structure and the third terminal portion to join together to form the first predetermined relationship;
in the second state, the first support structure and the third terminal portion are configured as one piece to form the second predetermined relationship; and
in the third state, the first support structure includes a first constraint portion and a second constraint portion opposite to the first constraint portion, and uses the first and the second constraint portions to constrain the third terminal portion to form the third predetermined relationship.

15. A support component for supporting a functional element, the support component comprising:
a main body;
a plurality of first support portions disposed on the main body, wherein each of the plurality of first support portions has a first support position thereon having a first height, and is configured to rigidly support the functional element; and
a plurality of second support portions disposed on the main body, wherein each of the plurality of second support portions is disposed between respective adjacent two of the plurality of first support portions, has a second support position thereon having a second height, and is configured to flexibly support the functional element, wherein:
when a configuration relationship between the support component and the functional element is a decoupling relationship, the second height is larger than the first height; and
when the configuration relationship is a coupling relationship, an absolute difference value between the first and the second heights is less than a threshold.

16. The support component according to claim 15, wherein:
the functional element has a specific function being one selected from a group consisting of a light using function, a force using function and an electricity using function;
when the specific function is the light using function and the light using function is a light transmission function, the functional element is a lens;
each of the plurality of first support portions includes a first support surface having the first support position;
each of the plurality of second support portions includes a second support surface having the second support position;

the plurality of first support positions are evenly spaced to form a first polar support position array;

the plurality of second support positions are evenly spaced to form a second polar support position array;

the support component supports the lens to form the coupling relationship, and further comprises a plurality of third support portions respectively opposite to the plurality of first support portions in relation to the main body, wherein each of the plurality of third support portions rigidly supports the main body, and includes a third support surface having a third support position, and the first support surface is opposite to the third support surface in relation to the main body;

the main body forms a ring, and includes a plurality of rigid body portions and a plurality of flexible body portions, wherein each of the plurality of flexible body portions and a corresponding one of the plurality of second support portions constitute a support beam;

the plurality of first support portions are respectively disposed on the plurality of rigid body portions, and the plurality of rigid body portions are respectively disposed on the plurality of third support portions;

each of the plurality of rigid body portions includes a first side, a second side opposite to the first side, a third side adjacent to the first and the second sides, and a fourth side opposite to the third side;

the respective first support portion is disposed on the respective first side, and the respective third support portion is coupled to the respective second side;

the plurality of second support portions are respectively disposed on the plurality of flexible body portions, each of which includes a central portion, a first terminal in relation to the central portion, and a second terminal opposite to the first terminal;

the respective second support portion is disposed on the respective central portion; and each of the plurality of flexible body portions is disposed between respective adjacent two of the plurality of rigid body portions, wherein the respective first terminal is coupled to the respective fourth side of one of respective adjacent two of the plurality of rigid body portions, and the respective second terminal is coupled to the respective third side of the other of the respective adjacent two of the plurality of rigid body portions.

17. The support component according to claim 16, included in a support device configured to support the functional element, wherein the support device further comprises:

a retainer including a peripheral thread structure, wherein when the configuration relationship is the coupling relationship, the support component is disposed on the retainer by using the plurality of third support portions; and a sleeve including a fifth side and a sixth side opposite to the fifth side, wherein:

the fifth side includes a first body and a plurality of fourth support portions, wherein the first body has an inner portion, and each of the plurality of fourth support portions is configured to be coupled to the lens, corresponds to a respective one of the plurality of first support portions, protrudes from the inner portion and includes a fourth support surface having a fourth support position;

the sixth side includes an inner thread structure; and when the configuration relationship is the coupling relationship, the lens is disposed on the plurality of first support portions and on the plurality of second support portions, the plurality of fourth support portions are disposed on the lens, the respective fourth support surface is opposite to the respective first support surface in relation to the lens, and the peripheral thread structure is coupled to the inner thread structure.

18. The support component according to claim 16, wherein:

each of the plurality of flexible body portions further includes a first flexible hinge, a first relatively rigid connection portion, a second flexible hinge and a second relatively rigid connection portion, wherein the first flexible hinge is disposed between the first terminal and the central portion, the first relatively rigid connection portion is disposed between the first flexible hinge and the central portion, the second flexible hinge is disposed between the central portion and the second terminal, and the second relatively rigid connection portion is disposed between the central portion and the second flexible hinge;

the central portion includes a central support block, a third flexible hinge coupled to the central support block, and a fourth flexible hinge coupled to the central support block;

the central support block includes a seventh side coupled to the respective second support portion, an eighth side adjacent to the seventh side, and a ninth side opposite to the eighth side;

the respective second support portion is disposed on the respective seventh side;

the third flexible hinge is disposed between the eighth side and the first relatively rigid connection portion;

the fourth flexible hinge is disposed between the ninth side and the second relatively rigid connection portion;

the support component further includes a central axis, a plurality of first outer locating notches respectively corresponding to the plurality of first support portions, and a plurality of second outer locating notches respectively corresponding to the plurality of second support portions;

each of the plurality of first outer locating notches has a portion formed on a respective one of the plurality of first support portions; and each of the second outer locating notches has a portion formed on a respective one of the plurality of second support portions.

19. The support component according to claim 18, wherein:

the central support block, the first flexible hinge, the second flexible hinge, the third flexible hinge and the fourth flexible hinge respectively have a first reference position, a second reference position, a third reference position, a fourth reference position and a fifth reference position;

the central axis and the first reference position have a first reference plane therebetween, the central axis and the second reference position have a second reference plane therebetween, the central axis and the third reference position have a third reference plane therebetween, the central axis and the fourth reference position have a fourth reference plane therebetween, and the central axis and the fifth reference position have a fifth reference plane therebetween;

the first and the second reference planes have a first predetermined angle therebetween to cause the first flexible hinge to be near the first terminal;

the first and the third reference planes have a second predetermined angle therebetween to cause the second flexible hinge to be near the second terminal;

the first and the fourth reference planes have a third predetermined angle therebetween to cause the third flexible hinge to be near the eighth side;

the first and the fifth reference planes have a fourth predetermined angle therebetween to cause the fourth flexible hinge to be near the ninth side; and the support component is formed as one piece.

20. The support component according to claim 16, wherein:

each of the plurality of flexible body portions further includes a first relatively rigid connection portion disposed between the respective first terminal and the respective central portion, and a second relatively rigid connection portion disposed between the respective central portion and the respective second terminal;

each the respective central portion includes:
- a first terminal portion coupled to the respective first relatively rigid connection portion;
- a second terminal portion coupled to the respective second relatively rigid connection portion;
- a relatively rigid body portion disposed between the respective first and the respective second terminal portions; and
- a flexible unit disposed between the respective first and the respective second terminal portions, located above the respective relatively rigid body portion, forming a flexible plate, and including a third terminal portion and a fourth terminal portion opposite to the third terminal portion, wherein the third and the fourth terminal portions are respectively coupled to the respective first and the respective second terminal portions, and the flexible unit and the respective second support portion constitute a flexible beam included in the support beam;

the flexible unit and the relatively rigid body portion have a gap therebetween;

the flexible unit further includes a first surface opposite to the relatively rigid body portion, and a second surface opposite to the first surface;

the respective second support portion is disposed on the second surface of the flexible unit;

the first and the second terminal portions respectively include a first support structure and a second support structure;

the first support structure and the third terminal portion have a first connection relationship therebetween to cause the first support structure to support the third terminal portion;

the second support structure and the fourth terminal portion have a second connection relationship therebetween to cause the second support structure to support the fourth terminal portion, wherein the second connection relationship corresponds to the first connection relationship;

the first connection relationship is one selected from a group consisting of a first predetermined relationship, a second predetermined relationship and a third predetermined relationship;

the central portion exists in one selected from a group consisting of a first state, a second state and a third state respectively associated with the first, the second and the third predetermined relationships;

in the first state, the central portion further includes a thread component causing the first support structure and the third terminal portion to join together to form the first predetermined relationship;

in the second state, the first support structure and the third terminal portion are configured as one piece to form the second predetermined relationship; and in the third state, the first support structure includes a first constraint portion and a second constraint portion opposite to the first constraint portion, and uses the first and the second constraint portions to constrain the third terminal portion to form the third predetermined relationship.

* * * * *